(12) United States Patent
Cano Salomo et al.

(10) Patent No.: US 12,396,110 B2
(45) Date of Patent: Aug. 19, 2025

(54) ELECTRICAL ASSEMBLY WITH LOCKING MEMBER FOR RELEASABLY LOCKING A FIRST HOUSING AND A SECOND HOUSING

(71) Applicant: Lear Corporation, Southfield, MI (US)

(72) Inventors: Oscar Cano Salomo, Tarragona (ES); Antoni Pujol Simon, Valls (ES); Joan Ignasi Ferran Palau, Valls (ES); Kapil Jadhav, Wakad Pune (IN); Sainath Shinde, New Nanded (IN); Gerard Vall, Valls (ES)

(73) Assignee: Lear Corporation, Southfield, MI (US)

( * ) Notice: Subject to any disclaimer, the term of this patent is extended or adjusted under 35 U.S.C. 154(b) by 654 days.

(21) Appl. No.: 17/557,584

(22) Filed: Dec. 21, 2021

(65) Prior Publication Data

US 2023/0199986 A1 Jun. 22, 2023

(51) Int. Cl.
*H05K 5/02* (2006.01)
*H01R 13/502* (2006.01)
(Continued)

(52) U.S. Cl.
CPC ......... *H05K 5/0221* (2013.01); *H01R 13/502* (2013.01); *H01R 13/508* (2013.01);
(Continued)

(58) Field of Classification Search
CPC .. H05K 5/0221; H05K 5/0217; H05K 5/0247; H01R 13/502; H01R 13/508;
(Continued)

(56) References Cited

U.S. PATENT DOCUMENTS 6,848,946 B2  2/2005  Vicenza et al.
7,473,124 B1*  1/2009  Briant ................. H01R 13/629
                                                          439/352
(Continued)

FOREIGN PATENT DOCUMENTS

CN        107211552 A     9/2017
CN        110658589 A     1/2020
(Continued)

OTHER PUBLICATIONS

German Office Action dated Jul. 14, 2023 for German Patent App. No. DE 102022130215.2 (w_English_transl.).
(Continued)

*Primary Examiner* — Justin M Kratt
(74) *Attorney, Agent, or Firm* — Fishman Stewart PLLC

(57) ABSTRACT

An electrical assembly may include a first housing unit, a second housing unit, and a locking member. The first housing unit may include a guide portion. The second housing unit may be releasably connectable to the first housing unit. The locking member may be configured to slidably engage the guide portion. The locking member may be adjustable relative to the first housing unit and the second housing unit to an unlocked position and a locked position. When the locking member is in the unlocked position, the second housing unit may be removable from the first housing unit. When the locking member is in the locked position, the second housing unit may be secured to the first housing unit via the locking member.

19 Claims, 21 Drawing Sheets

(51) Int. Cl.
    *H01R 13/508*   (2006.01)
    *H01R 13/627*   (2006.01)
    *H01R 13/629*   (2006.01)
    *B60R 16/023*   (2006.01)
    *H01R 13/516*   (2006.01)
    *H01R 13/52*    (2006.01)
    *H01R 13/62*    (2006.01)

(52) U.S. Cl.
    CPC ... *H01R 13/6275* (2013.01); *H01R 13/62916* (2013.01); *H01R 13/62977* (2013.01); *H05K 5/0217* (2013.01); *H05K 5/0247* (2013.01); *B60R 16/0238* (2013.01); *H01R 13/516* (2013.01); *H01R 13/52* (2013.01); *H01R 13/5202* (2013.01); *H01R 13/62* (2013.01); *H01R 13/627* (2013.01); *H01R 13/629* (2013.01); *H01R 13/62905* (2013.01)

(58) Field of Classification Search
    CPC .......... H01R 13/6275; H01R 13/62916; H01R 13/62977; H01R 13/516; H01R 13/52; H01R 13/5202; H01R 13/62; H01R 13/627; H01R 13/629; H01R 13/62905; B60R 16/0238
    See application file for complete search history.

(56) References Cited

U.S. PATENT DOCUMENTS

| | | |
|---|---|---|
| 9,509,096 B2 | 11/2016 | Zhao et al. |
| 9,728,363 B2 | 8/2017 | Carnick et al. |
| 9,979,126 B2 * | 5/2018 | Takamura ........ H01R 13/62933 |
| 10,091,902 B2 | 10/2018 | Lyon et al. |
| 10,431,931 B2 | 10/2019 | Pieknik et al. |
| 2014/0192457 A1 | 7/2014 | Zhao |
| 2020/0220286 A1 * | 7/2020 | Bettman .............. H01R 13/502 |
| 2021/0408727 A1 * | 12/2021 | Fan ................... H01R 13/6275 |

FOREIGN PATENT DOCUMENTS

| | | | |
|---|---|---|---|
| JP | 2020088969 A | 6/2020 | |
| WO | WO-2013182601 A1 * | 12/2013 | ............ H01R 13/53 |

OTHER PUBLICATIONS

Chinese Office Action and Search Report, CN202211185446.7, dated Dec. 7, 2024 (w_translation).

* cited by examiner

ELECTRICAL ASSEMBLY WITH LOCKING MEMBER FOR RELEASABLY LOCKING A FIRST HOUSING AND A SECOND HOUSING

TECHNICAL FIELD

The present disclosure generally relates to electrical assemblies, including electrical assemblies that may include electrical units, electrical unit housings, and/or electrical connectors that may, for example, be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies may be relatively complex to use and/or to assemble. For example, with some designs, connecting a first housing unit and a second housing unit may be a complex process, may include many different components, and/or may not result in a sufficiently secure connection.

There is a desire for solutions/options that minimize or eliminate one or more challenges or shortcomings of electrical assemblies. The foregoing discussion is intended only to illustrate examples of the present field and is not a disavowal of scope.

SUMMARY

In embodiments, an electrical assembly may include a first housing unit, a second housing unit, and/or a locking member. The first housing unit may include a guide portion. The second housing unit may be releasably connectable to the first housing unit. The locking member may be configured to slidably engage the guide portion. The locking member may be adjustable relative to the first housing unit and the second housing unit to an unlocked position and a locked position. When the locking member is in the unlocked position, the second housing unit may be removable from the first housing unit. When the locking member is in the locked position, the second housing unit may be secured to the first housing unit via the locking member.

In embodiments, an electrical assembly may include a first housing unit, a second housing unit, and a locking member. The first housing unit may include a guide portion having a groove. The second housing unit may be releasably connectable to the first housing unit. The second housing unit may include a connector, a tab, a hook member, and/or a hook connector. The locking member may include a slot configured to receive the connector, a flange configured to slidably engage the groove of the guide portion, and/or a latch configured to engage the tab. The connector may be slidably disposed in the slot. The locking member may be adjustable relative to first housing unit and the second housing unit to an unlocked position and a locked position. When the locking member is in the unlocked position, the second housing unit may be removable from the first housing unit, the connector may be disposed in a first slot portion of the slot, the hook connector may be engaged with the locking member, and/or the locking member may be connected to the second housing unit via the connector and the hook connector. When the locking member is in the locked position, the flange may be engaged with the groove and may connect the locking member to the first housing unit, the connector may be disposed in a second slot portion of the slot, the latch may be engaged with the tab and may resist adjustment of the locking member toward the unlocked position, the hook member may be engaged with the locking member, and/or the second housing unit may be secured to the first housing unit via the locking member.

In embodiments, a method of assembling an electrical assembly may include releasably connecting a first housing unit and a second housing unit. The method may include restricting the first housing unit and the second housing unit from disconnecting from one another via adjusting a locking member from an unlocked position to a locked position. Adjusting a locking member from the unlocked position to the locked position may include engaging the locking member with a guide portion of the first housing unit.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

DETAILED DESCRIPTION

Figure 1A:
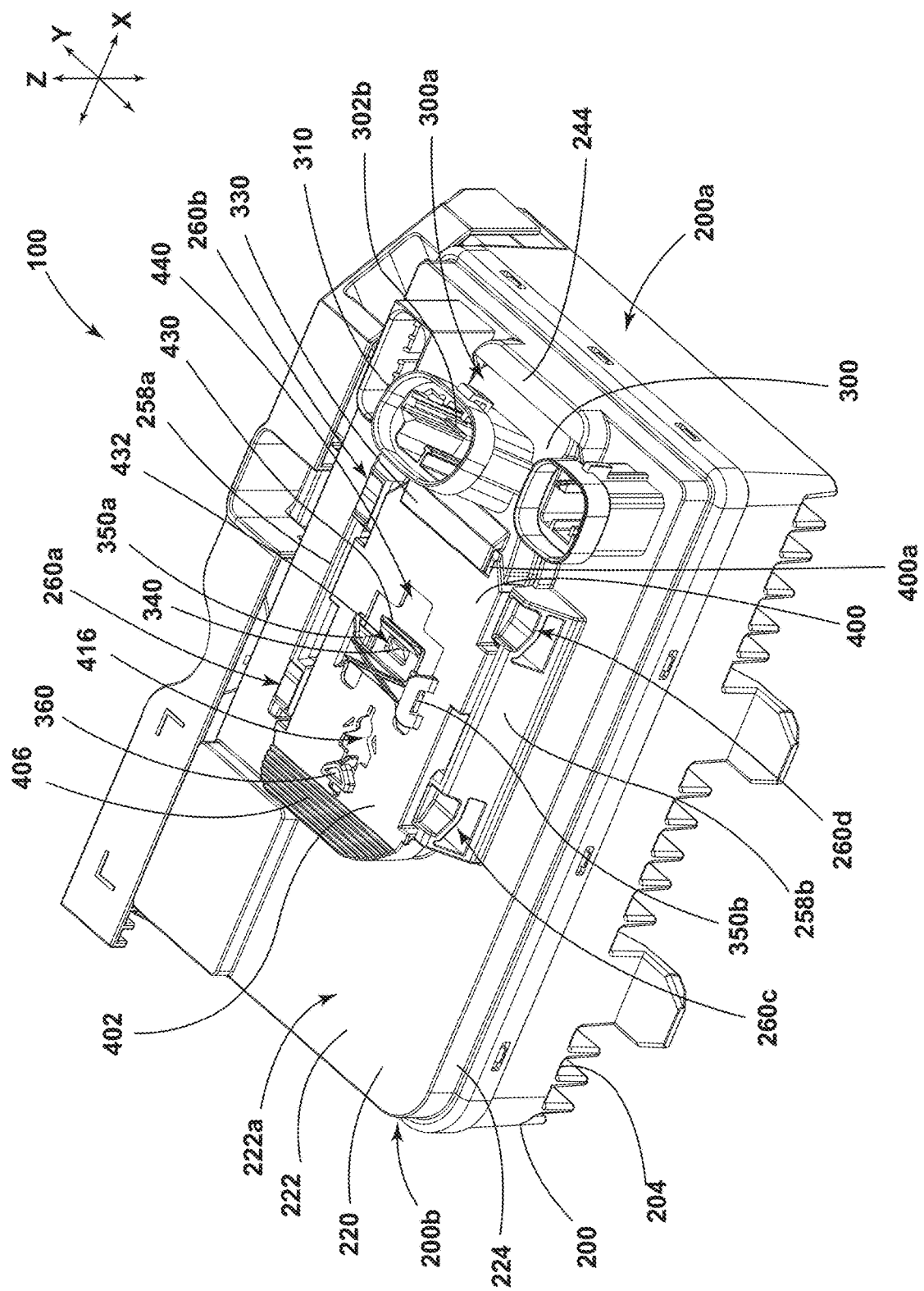
FIGS. 1A and 1B are perspective views generally illustrating an embodiment of an electrical assembly according to teachings of the present disclosure.
Figure 1B:
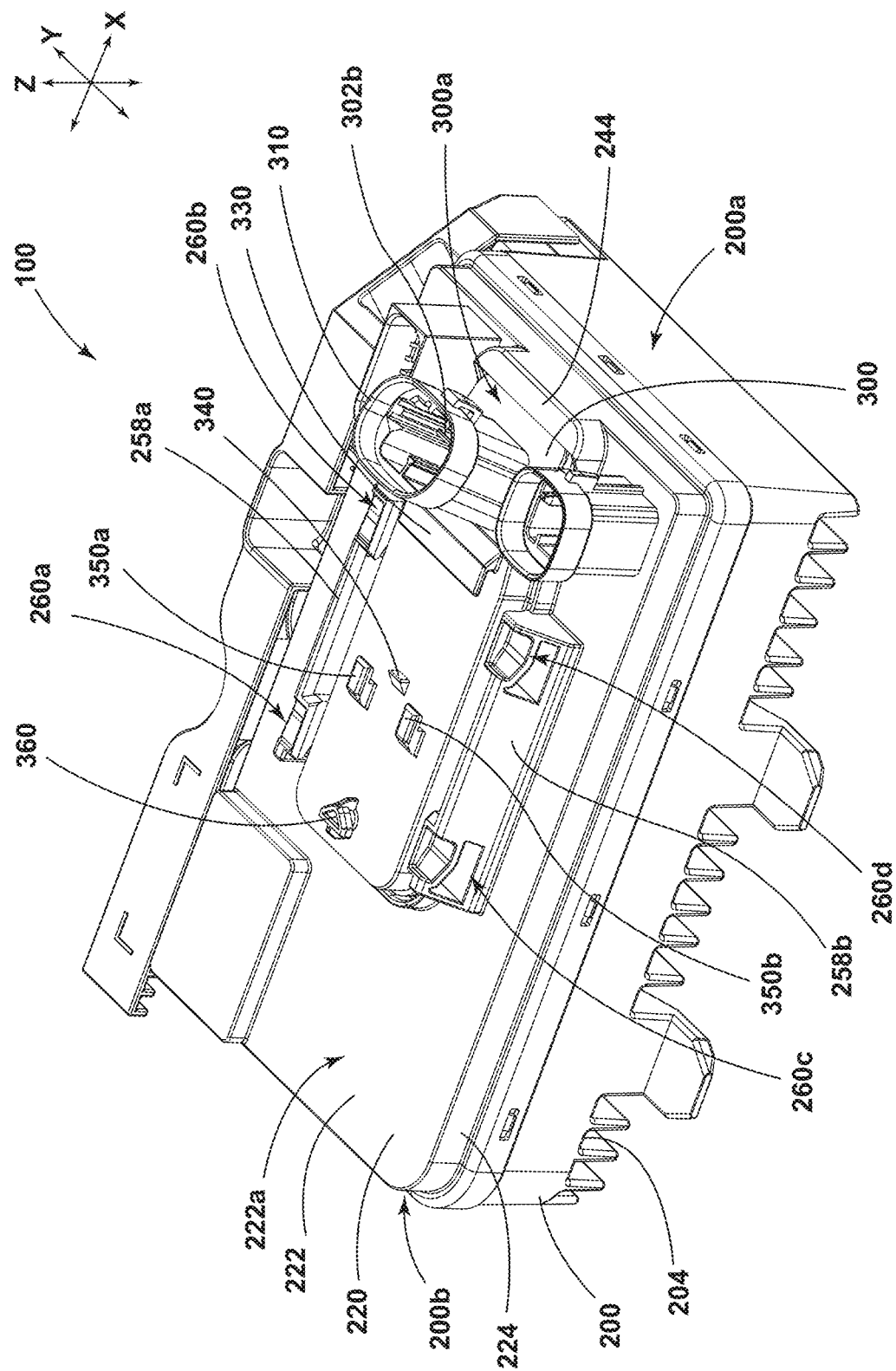
Figure 2:
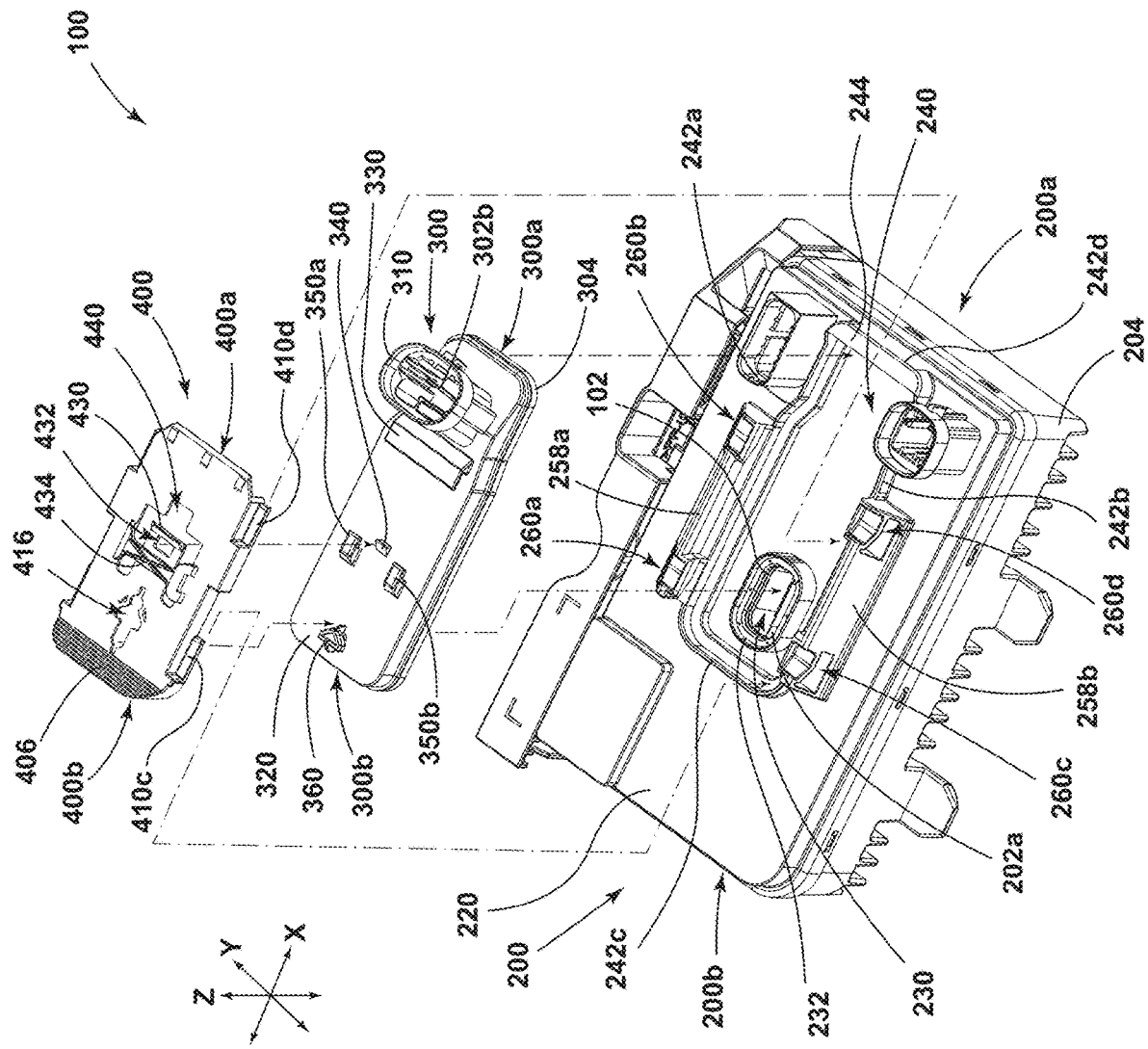
FIG. 2 is a partially exploded view generally illustrating an embodiment of an electrical assembly according to teachings of the present disclosure.

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

With embodiments, such as generally illustrated in FIGS. 1A-2 and 9-11C, an electrical assembly 100 may include a first housing unit 200 (e.g., a power distribution box), a second housing unit 300 (e.g., a fuse box), and/or a locking member 400. An electrical assembly 100 may be configured to receive and/or distribute electrical power to one or more other components (e.g., vehicle components/systems). A first housing unit 200 may be connectable to and/or mountable on a support structure, such as of a vehicle. A second housing unit 300 may be connectable to and/or mountable on a first housing unit 200, which may establish a mechanical connection and/or an electrical connection therebetween. A locking member 400 may be releasably connectable to a first housing unit 200 and/or a second housing unit 300, such as to secure, lock, and/or fix the second housing unit 300 to the first housing unit 200.

With embodiments, such as generally illustrated in FIGS. 1A-3B, a first housing unit 200 may have a generally rectangular shape and/or may be configured to receive and/or retain one or more first electrical components 202, such as circuit boards, relays, fuses, switches, controllers, capacitors, resistors, inductors, diodes, etc. (see, e.g., FIGS. 9, 10B, 10D, and 11B). One or more first electrical components 202 may include one or more first electrical contacts 202a (see, e.g., FIGS. 3A and 10D). A first housing unit 200 may have a first base 204 and a first cover 220. A first cover 220 may be releasably connectable (e.g., via one or more connectors, fasteners, latches, etc.) to a first base 204, such as to close the first base 204 and/or define a first internal space 206 (see, e.g., FIGS. 9, 10B, 10D, and 11B). One or more first electrical components 202 may be disposed in the first internal space 206.

Figure 3A:
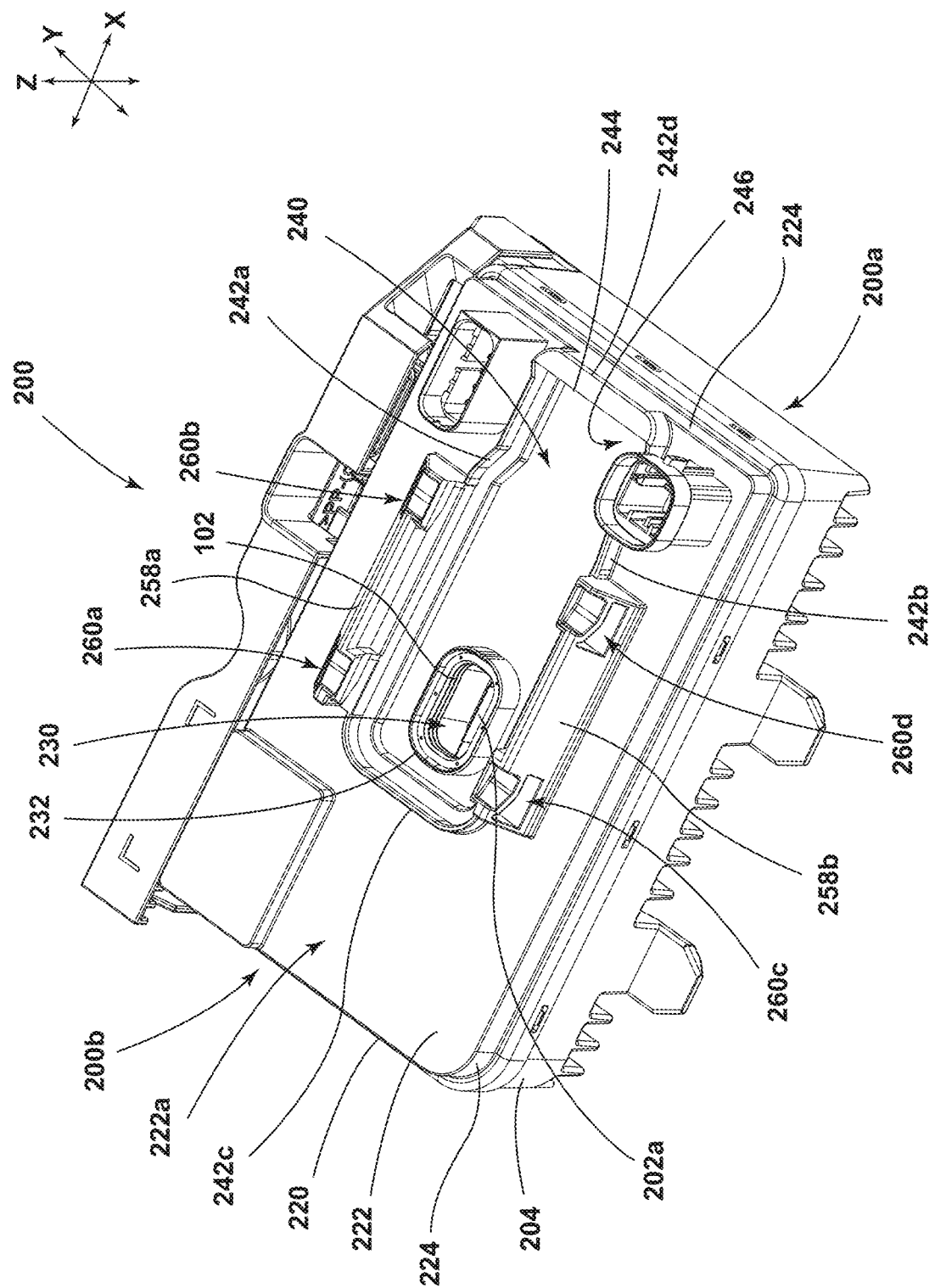
FIG. 3A is a perspective view generally illustrating an embodiment of a first housing unit according to teachings of the present disclosure.
Figure 3B:
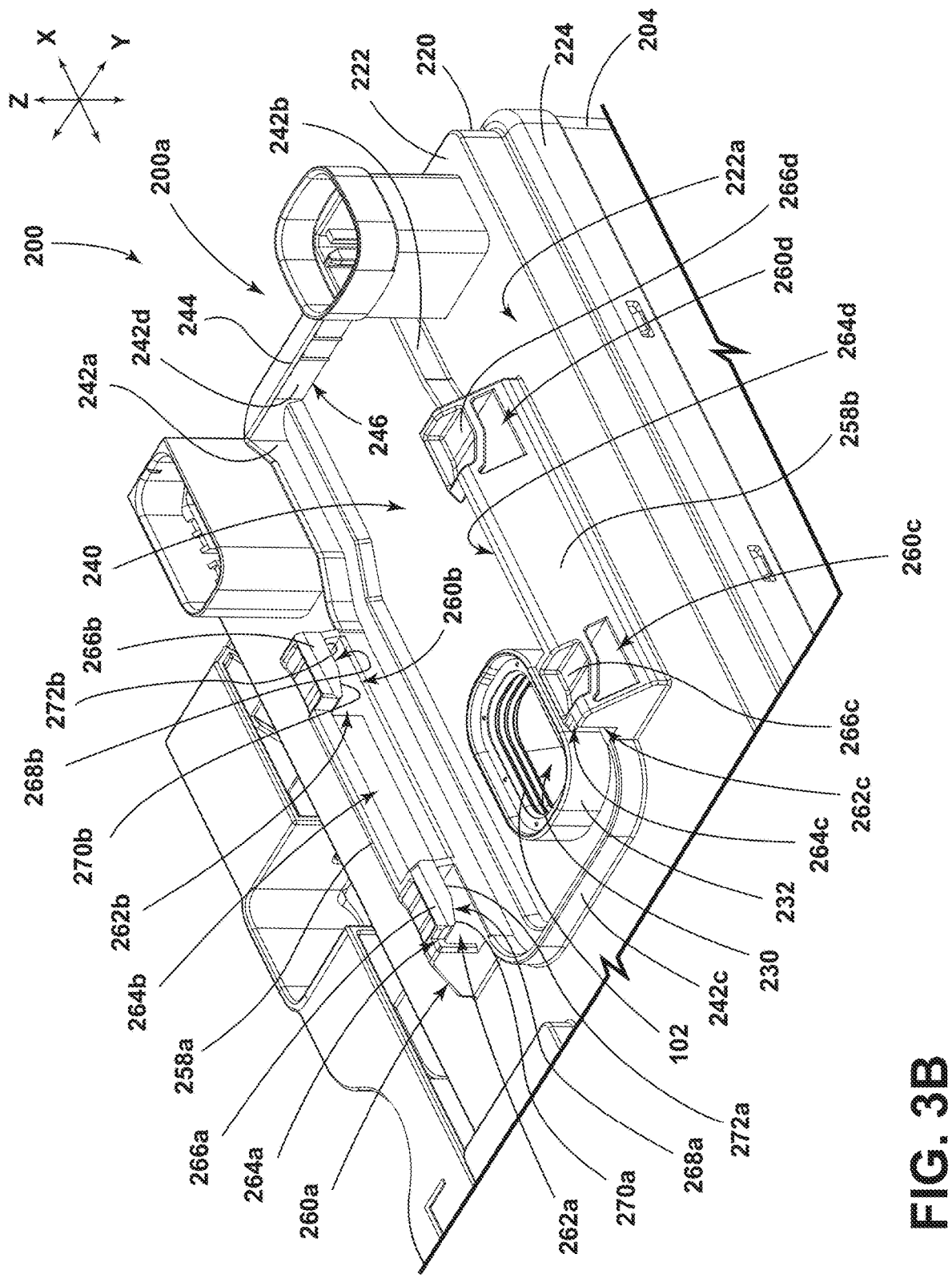
FIG. 3B is an enlarged partial perspective view generally illustrating portions of an embodiment of a first housing unit according to teachings of the present disclosure.

With embodiments, such as generally illustrated in FIGS. 3A and 3B, a first cover 220 may include a first main portion 222 and one or more first wall portions 224. A first main portion 222 may be generally planar and/or have a generally rectangular shape. One or more first wall portions 224 may project away from the first main portion 222 generally in a Z-direction (e.g., perpendicularly or obliquely relative to the first main portion 222), and/or may be configured to engage, contact, and/or abut a first base 204. A first main portion 222 may have a first external surface 222a, which may face generally in a Z-direction.

With embodiments, such as generally illustrated in FIGS. 3A and 3B, a first cover 220 and/or a first main portion 222 may include an electrical connector aperture 230 and/or one or more aperture walls 232. An electrical connector aperture 230 may be configured to receive at least a portion of a second housing unit 300 (e.g., a first electrical connector 308 and/or a second electrical contact 302a—see FIG. 4B), such as to facilitate establishing a mechanical connection and/or electrical connection between the first housing unit 200 and the second housing unit 300. An electrical connector aperture 230 may be disposed in a first external surface 222a of a first main portion 222 of a first cover 220 and/or may extend through a first main portion 222 to a first internal space 206 of a first housing unit 200 (see, e.g., FIG. 9). In some examples, an electrical connector aperture 230 may be defined by and/or extend through a portion of a first main portion 222 that defines a receptacle 240. An electrical connector aperture 230 may be at least partially defined by a first main portion 222 of a first cover 220 and/or one or more aperture walls 232. One or more first electrical components 202 disposed in the first housing unit 200, such as one or more first electrical contacts 202a, may be disposed in and/or project into the electrical connector aperture 230 (see, e.g., FIGS. 3A and 10D). When a first electrical connector 308 of a second housing unit 300 is engaged with and/or disposed/received in the electrical connector aperture 230, a first electrical contact 202a of the first housing unit 200 may engage, contact, and/or abut one or more second electrical contacts 302a of the second housing unit 300 (see, e.g., FIG. 10D), which may establish an electrical connection between the first housing unit 200 and/or the second housing unit 300.

With embodiments, such as generally illustrated in FIGS. 3A and 3B, a first cover 220 and/or a first main portion 222 may include a receptacle 240, one or more receptacle walls 242, and/or a flange 244. A receptacle 240 may be configured to receive at least a portion of a second housing unit 300 (e.g., a second base 304 and/or a second cover 320). A receptacle 240 may be at least partially defined by a first external surface 222a of a first main portion 222 and/or one or more receptacle walls 242a-d. In at least some embodiments, a receptacle 240 may be configured as a depression disposed in a first external surface 222a of a first cover 220.

With embodiments, such as generally illustrated in FIGS. 3A and 3B, one or more receptacle walls 242a-d may be configured to engage, contact, and/or abut a second housing unit 300. One or more receptacle walls 242a-d may project away from a first main portion 222 (e.g., a first external surface 222a) generally in a Z-direction (e.g., perpendicularly or obliquely relative to the first main portion 222) and/or extend along the first main portion 222 generally in an X-direction and/or a Y-direction. One or more receptacle walls 242a-d may extend partially or completely around an outer periphery of a receptacle 240 and/or may at least partially define the receptacle 240. One or more receptacle walls 242a-d may be configured as and/or defined by a portion of a first wall portion 224 of the first cover 220. One or more receptacle walls 242a-d may include a first receptacle wall 242a, a second receptacle wall 242b, a third receptacle wall 242c, and/or a fourth receptacle wall 242d. A first receptacle wall 242a and a second receptacle wall 242*b* may be disposed opposite one another and/or extend generally in an X-direction. A third receptacle wall 242*c* and a fourth receptacle wall 242*d* may be disposed opposite one another, may extend generally in a Y-direction, and/or may extend between and/or connect an end of a first receptacle wall 242*a* to an end of a second receptacle wall 242*b*. A third receptacle wall 242*c* may be disposed closer to a second end 200*b* of the first housing unit 200 than a fourth receptacle wall 242*d*. A fourth receptacle wall 242*d* may be disposed closer to a first end 200*a* of the first housing unit 200 than a third receptacle wall 242*c*.

With embodiments, such as generally illustrated in FIGS. 3A and 3B, a flange 244 may protrude from a fourth receptacle wall 242*d* generally toward a third receptacle wall 242*c* (e.g., generally in a X-direction). A flange 244 may be spaced apart from the first main portion 222 and/or the first external surface 222*a* (e.g., at a free end of the fourth receptacle wall 242*d*). A flange 244 may extend longitudinally generally in a Y-direction (e.g., along the free end of the fourth receptacle wall 242*d*). A flange 244 may extend between and/or connect a first receptacle wall 242*a*, a second receptacle wall 242*b*, and/or a fourth receptacle wall 242*d*. A flange 244, a first receptacle wall 242*a*, a second receptacle wall 242*b*, and/or a fourth receptacle wall 242*d* may at least partially define an opening 246, which may open toward a third receptacle wall 242*c* (e.g., generally in an X-direction). An opening 246 may be configured to receive and/or retain at least a portion of a second housing unit 300 (e.g., a first end 300*a* of a second housing unit 300) (see, e.g., FIGS. 9, 10B, and 11B).

With embodiments, such as generally illustrated in FIGS. 3A and 3B, a first cover 220 may include one or more guide portions 258*a*, 258*b* (e.g., a first guide portion 258*a* and/or a second guide portion 258*b*), which may be configured to engage, contact, and/or receive at least a portion of a locking member 400. A guide portion 258*a*, 258*b* may project away from a first main portion 222 (e.g., a first external surface 222*a*) of a first cover 220 generally in a Z-direction (e.g., perpendicularly or obliquely relative to the main portion). A guide portion 258*a*, 258*b* may be disposed adjacent and/or proximal to a receptacle 240 and/or one or more receptacle walls 242*a*, 242*b*. A guide portion 258*a*, 258*b* may additionally and/or alternatively be integrally formed with and/or defined by a portion of one or more receptacle walls 242*a*, 242*b*. A guide portion 258*a*, 258*b* may include one or more guide sections 260*a-d*, which may be configured to engage a portion of a locking member 400 (e.g., a locking member flange 410*a-d*) and/or guide a movement/adjustment of a locking member 400.

Figure 10A:
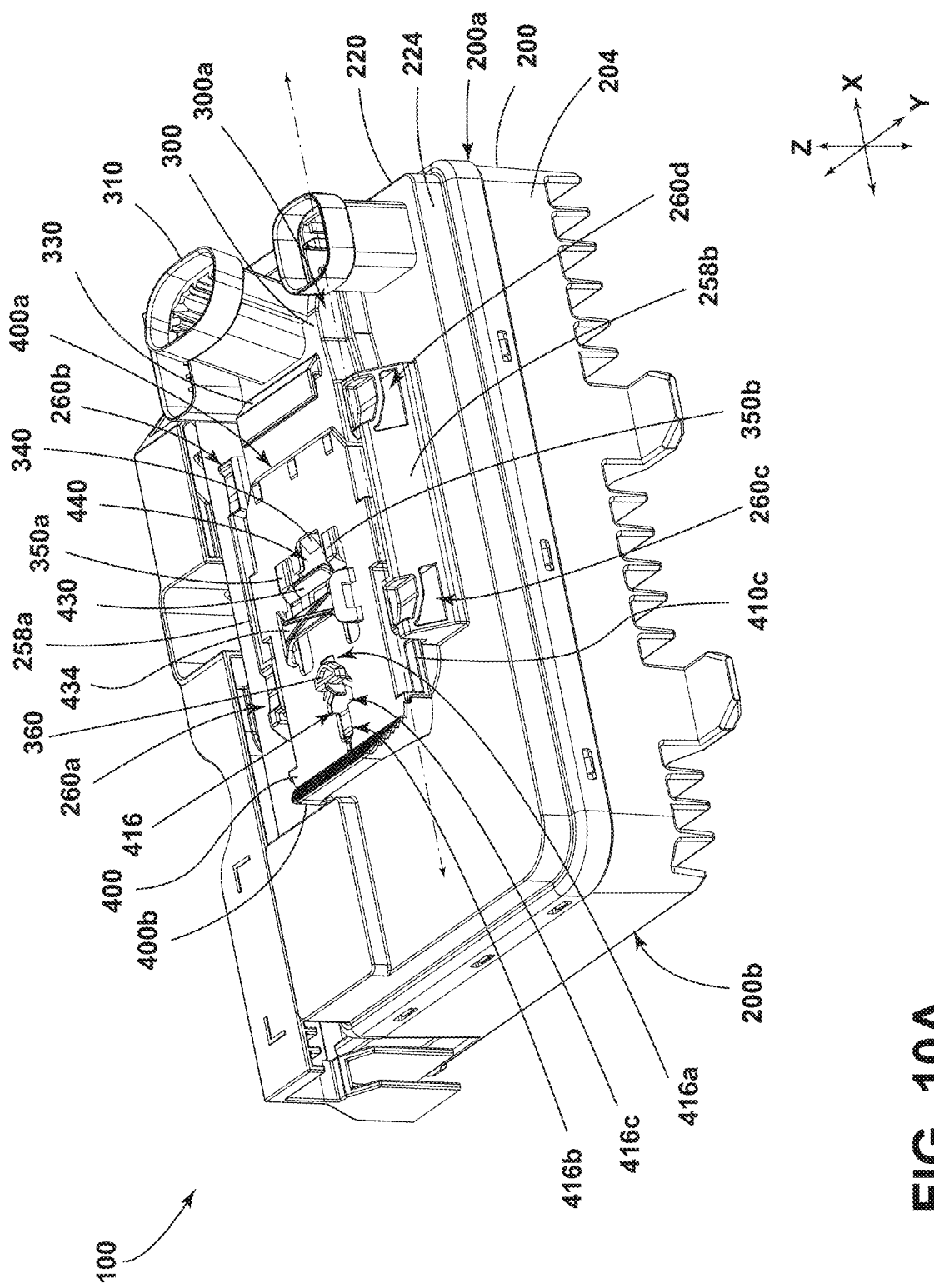
FIGS. 10A, 10B, 10C, and 10D are a perspective view, a first cross-sectional perspective view, a top view, and a second cross-sectional perspective view, respectively, generally illustrating an embodiment of a first housing unit, a second housing unit, and a locking member in an unlocked position according to teachings of the present disclosure.
Figure 10B:
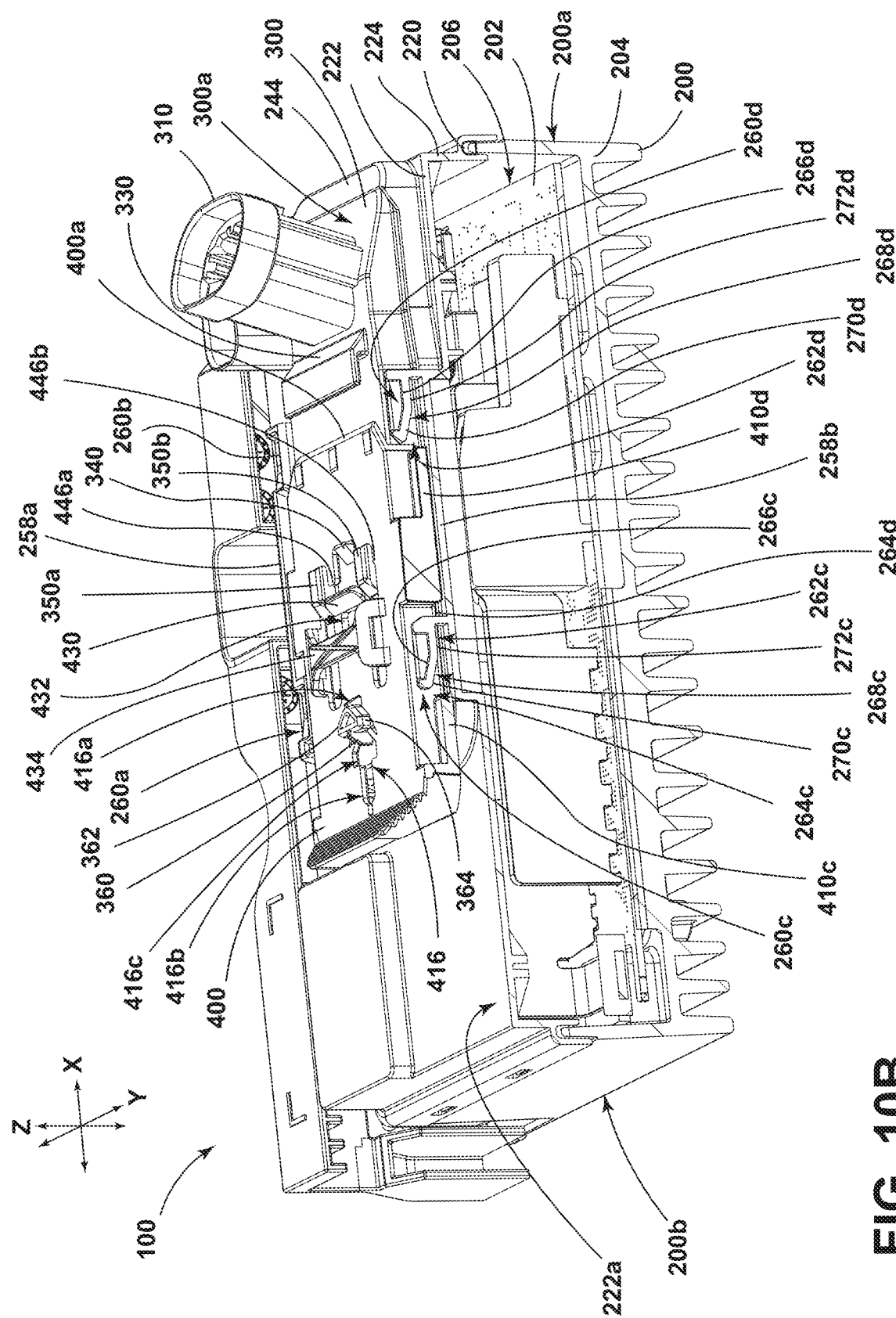
Figure 10C:
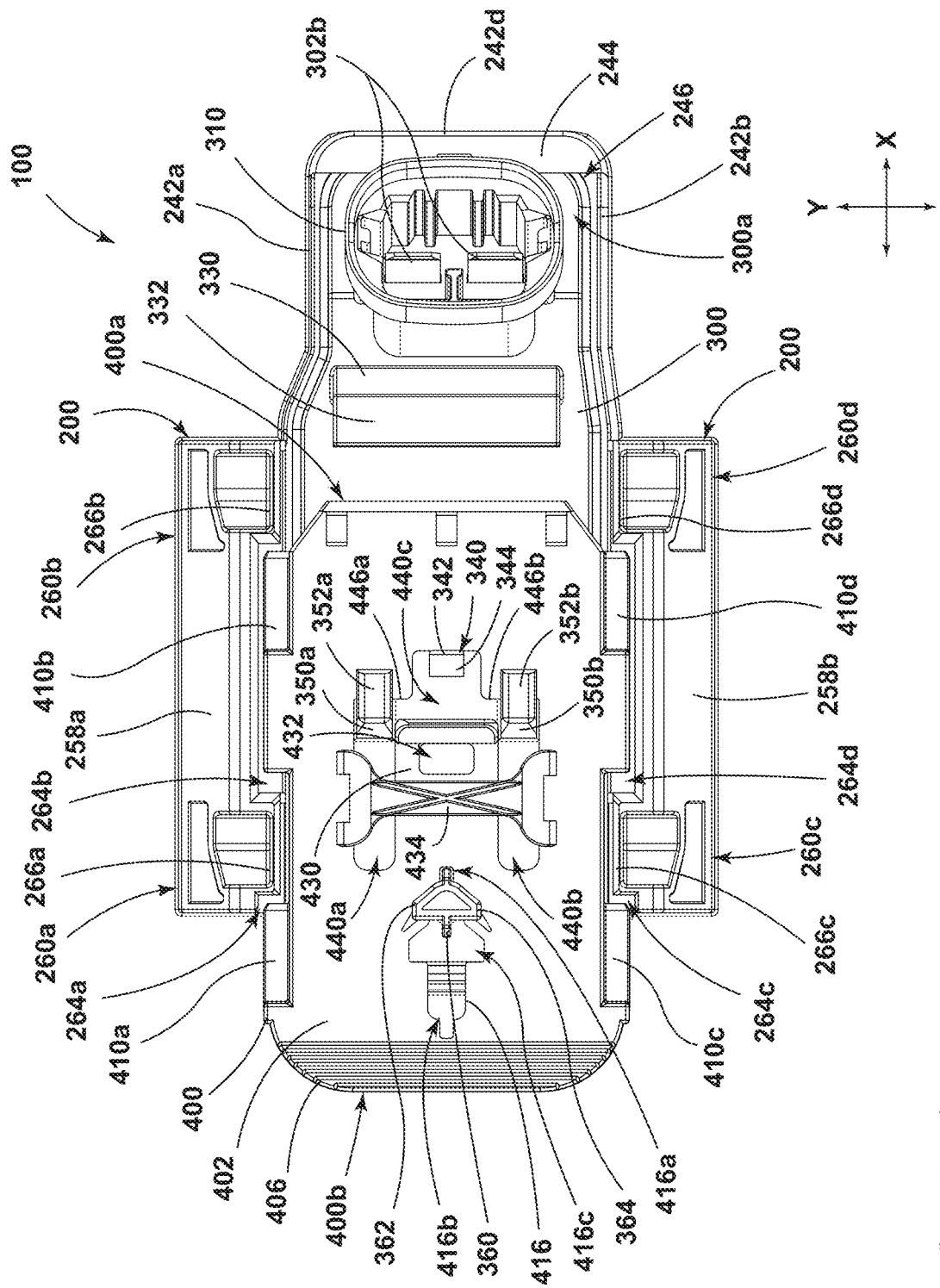
Figure 10D:
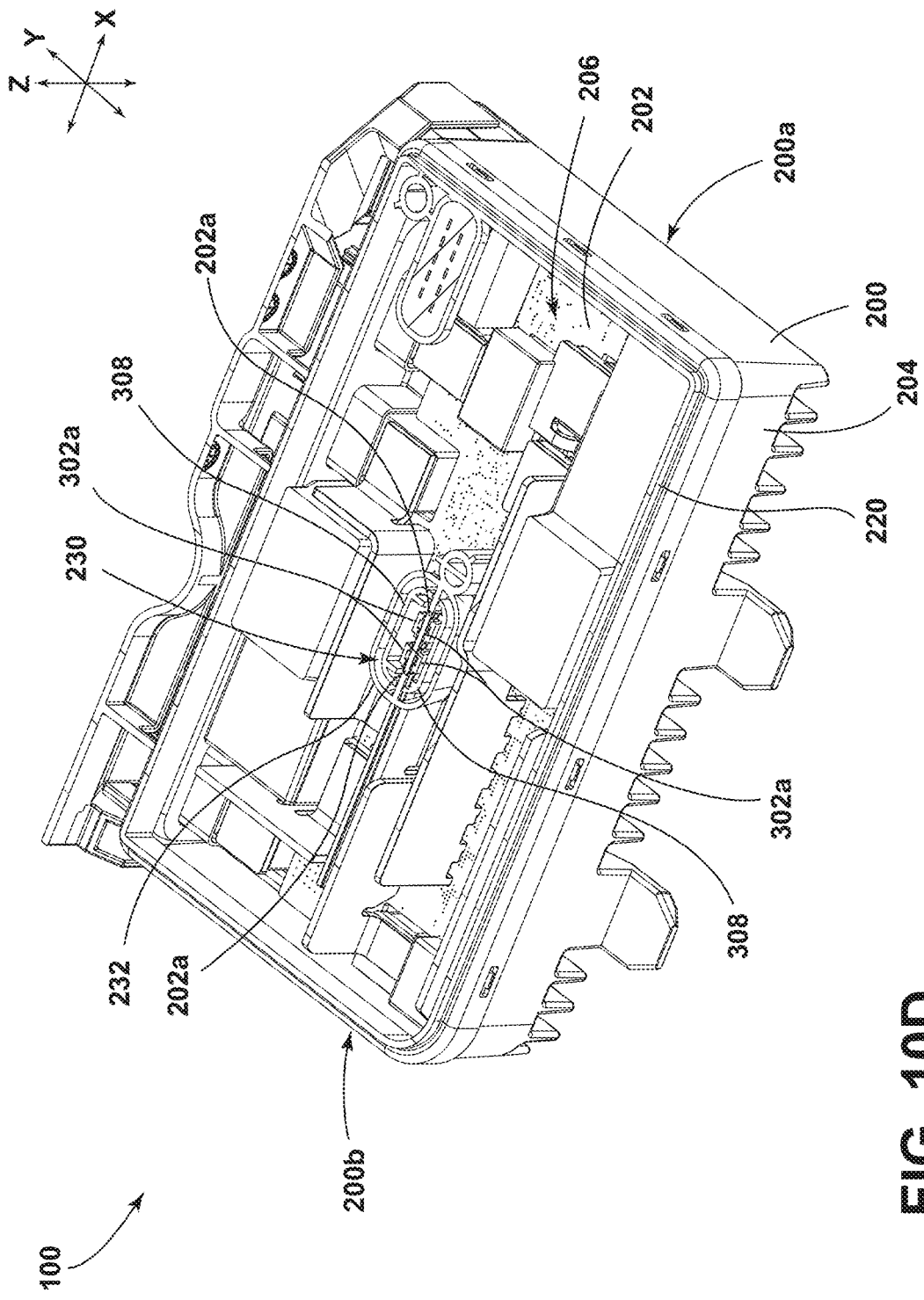
Figure 11A:
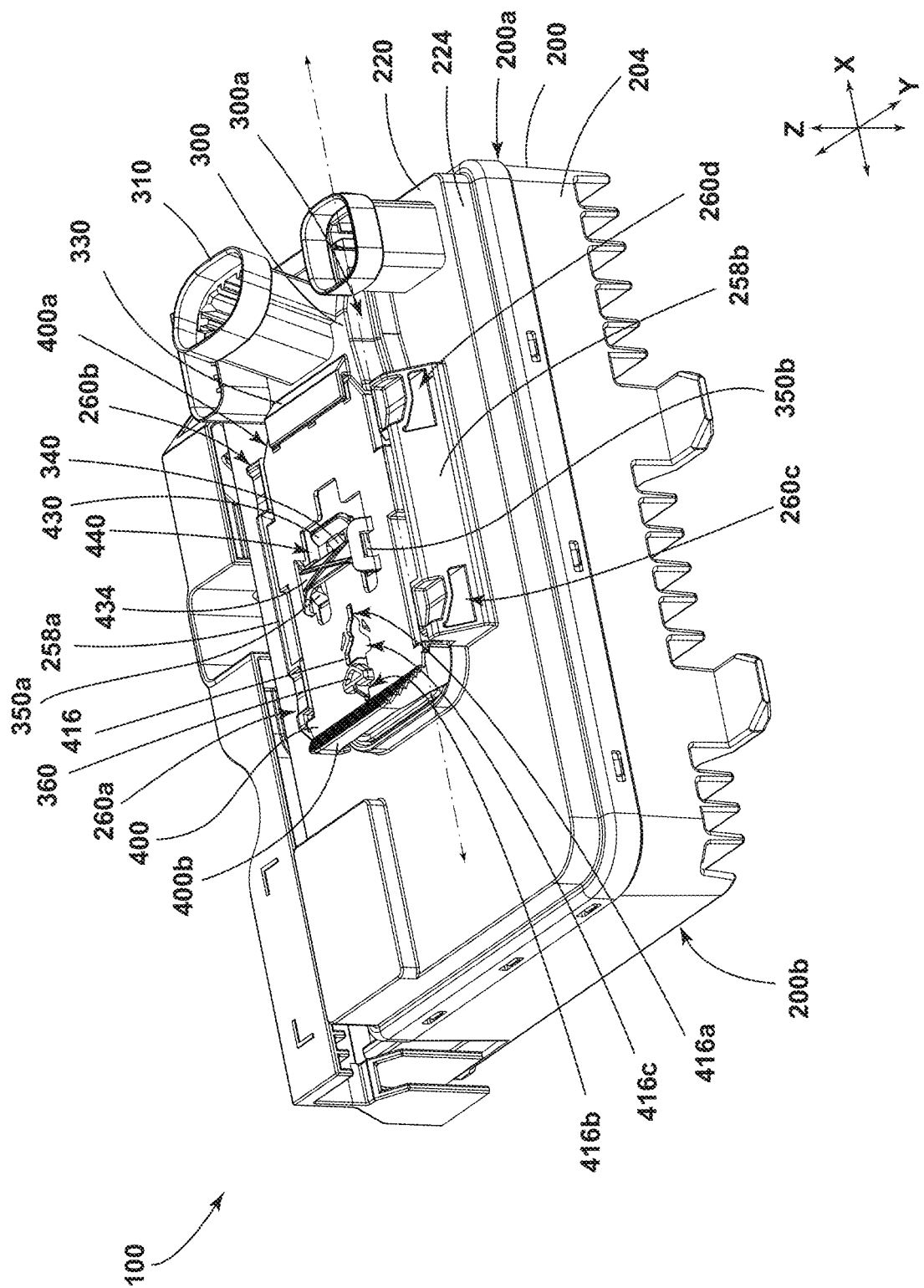
FIGS. 11A, 11B, and 11C are a perspective view, a cross-sectional view, and a top view, respectively, generally illustrating an embodiment of a first housing unit, a second housing unit, and a locking member in a locked position according to teachings of the present disclosure.
Figure 11B:
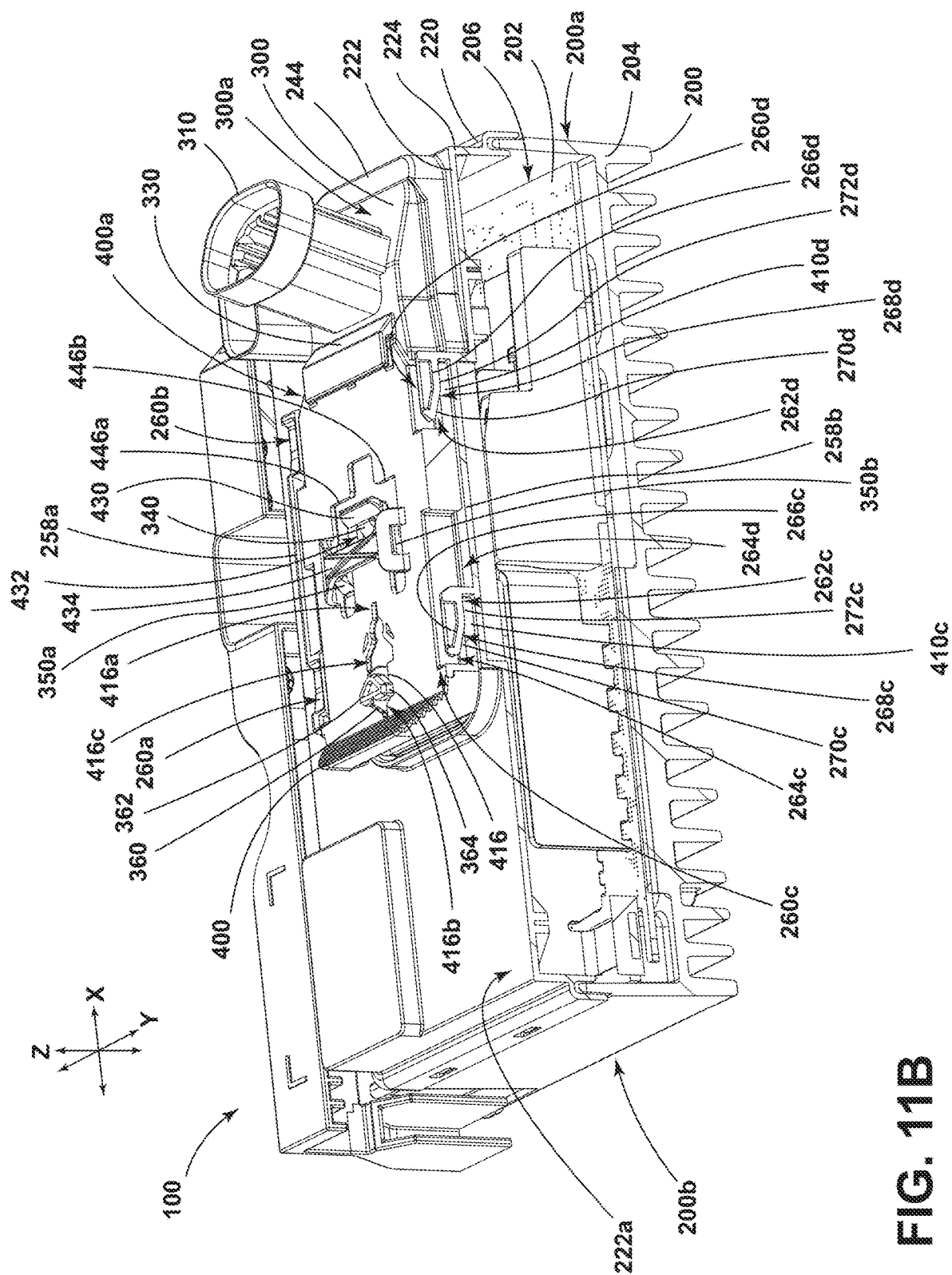
Figure 11C:
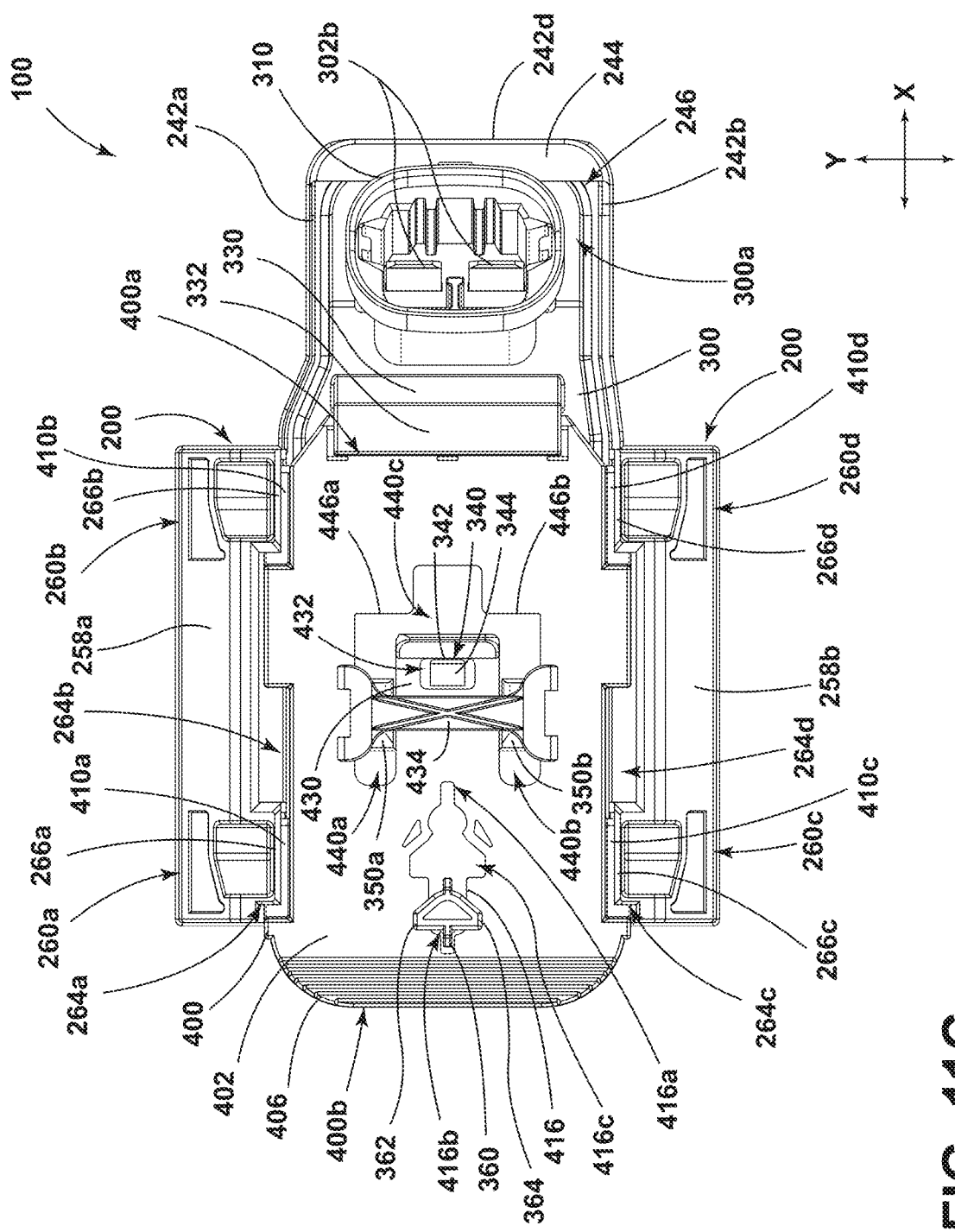

With embodiments, such as generally illustrated in FIGS. 3B, 10B, and 11B, a guide section 260*a-d* may be configured to engage a portion of a locking member 400 (e.g., a locking member flange 410*a-d*) and/or guide a movement/adjustment of a locking member 400. A guide section 260*a-d* may include a groove 262*a-d* configured to receive at least a portion of a locking member 400 (e.g., a locking member flange 410*a-d*). A groove 262*a-d* may extend generally in an X-direction and/or may protrude into a guide portion 258*a*, 258*b* (e.g., generally in a Y-direction) such that the groove 262*a-d* opens towards a receptacle 240 of the first cover 220. A guide section 260*a-d* may include a notch 264*a-d*. A notch 264*a-d* may extend through a guide portion 258*a*, 258*b* generally in a Z-direction to the groove 262*a-d* and/or may facilitate moving, adjusting, and/or inserting a portion of a locking member 400 (e.g., a locking member flange 410*a-d*) into the groove 262*a-d* (e.g., generally in Z-direction). A guide section 260*a-d* may include a protrusion 266*a-d* that may at least partially define a groove 262*a-d* and/or a notch 264*a-d*. A protrusion 266*a-d* may be disposed spaced apart from a first main portion 222 and/or one or more receptacle walls 242*a*, 242*b*. A protrusion 266*a-d* may include a guide surface 268*a-d*, which may at least partially define a groove 262*a-d* and/or may face generally toward a first cover 220 and/or a receptacle wall 242*a*, 242*b* (e.g., generally in a Z-direction). A guide surface 268*a-d* may include a first surface portion 270*a-d* (e.g., a sloped portion) and/or a second surface portion 272*a-d* (e.g., a flat portion). A first surface portion 270*a-d* may extend from a notch 264*a-d* to the second surface portion 272*a-d*. A first surface portion 270*a-d* may be sloped and/or angled toward a first housing unit 200 (e.g., a first internal space 206). In some examples, a height of the groove 262*a-d* (e.g., generally in a Z-direction) may decrease as the first surface portion 270*a-d* approaches the second surface portion 272*a-d*, such as generally in an X-direction. A first surface portion 270*a-d* may be configured to guide, move, adjust, etc. a locking member 400 toward a first housing unit 200 (e.g., generally in a Z-direction) when adjusting a locking member 400 toward a locked position, which may adjust and/or press the second housing unit 300 toward/against a first housing unit 200, which may provide a tight mechanical connection between the first housing unit 200 and the second housing unit 300.

With embodiments, such as generally illustrated in FIG. 3B, a first guide portion 258*a* may be disposed adjacent to, connected to, and/or formed by a portion of a first receptacle wall 242*a*. A first guide portion 258*a* may include a first guide section 260*a* and/or a second guide section 260*b*. A first guide section 260*a* may be disposed adjacent and/or proximate to a fourth receptacle wall 242*d*. A first guide section 260*a* may be configured to engage a first locking member flange 410*a*. A first guide section 260*a* may include a first groove 262*a*, a first notch 264*a*, a first protrusion 266*a*, and/or a first guide surface 268*a* having a first surface portion 270*a* and/or a second surface portion 272*a*. A second guide section 260*b* may be disposed adjacent and/or proximate to a third receptacle wall 242*c*. A second guide section 260*b* may be configured to engage a second locking member flange 410*b*. A second guide section 260*b* may include a second groove 262*b*, a second notch 264*b*, a second protrusion 266*b*, and/or a second guide surface 268*b* having a first surface portion 270*b* and/or a second surface portion 272*b*.

With embodiments, such as generally illustrated in FIGS. 10B and 11B, a second guide portion 258*b* may be disposed adjacent to, connected to, and/or formed by a portion of a second receptacle wall 242*b*. A second guide portion 258*b* may include a third guide section 260*c* and/or a fourth guide section 260*d*. A third guide section 260*c* may be disposed adjacent and/or proximate to a fourth receptacle wall 242*d*. A third guide section 260*c* may be configured to engage a third locking member flange 410*c*. A third guide section 260*c* may include a third groove 262*c*, a third notch 264*c*, a third protrusion 266*c*, and/or a third guide surface 268*c* having a first surface portion 270*c* and/or a second surface portion 272*c*. A fourth guide section 260*d* may be disposed adjacent and/or proximal to a third receptacle wall 242*c*. A fourth guide section 260*d* may be configured to engage a fourth locking member flange 410*d*. A fourth guide section 260*d* may include a fourth groove 262*d*, a fourth notch 264*d*, a fourth protrusion 266*d*, and/or a fourth guide surface 268*d* having a first surface portion 270*d* and/or a second surface portion 272*d*.

With embodiments, one or more guide portions 258*a*, 258*b* and/or one or more guide sections 260*a-d* may not project from a first main portion 222 generally upward in a Z-direction and/or may not be easily visible when the first housing unit 200 and the second housing unit 300 are assembled. For example, a guide portion 258a, 258b and/or one or more portions thereof may be defined by and/or configured as a portion of a first main portion 222 of a first cover 220. A notch 264a-d of the guide portion 258a, 258b may be disposed (e.g., directly) in a first external surface 222a of the first main portion 222 (e.g., adjacent to a receptacle 240) and/or a protrusion 266a-d of the guide portion 258a, 258b may be defined by and/or configured as a portion of a first main portion 222 (e.g., a portion of a first external surface 222a may define and/or form an external surface of a protrusion 266a-d). Additionally and/or alternatively, a guide portion 258a, 258b and/or one or more portions thereof may be disposed substantially within a receptacle 240, may be disposed in and/or defined by one or more surfaces that define the receptacle 240, and/or may be defined by and/or configured as a portion of a receptacle wall 242a-d. In such examples, at least a portion of a locking member 400 (e.g., one or more locking member wall portions 404 and/or one or more locking member flanges 410a-d) may be insertable into a receptacle 240, such as to engage the one or more guide portions 258a, 258b.

With embodiments, such as generally illustrated in FIGS. 1A-2 and 4A-4C, a second housing unit 300 may have a generally rectangular shape and/or may be configured to receive and/or retain one or more second electrical components 302, such as circuit boards, relays, fuses, switches, controllers, capacitors, resistors, inductors, diodes, etc. (see, e.g., FIG. 9). A second electrical component 302 may include one or more second electrical contacts 302a (see, e.g., FIGS. 4C and 10D) and/or one or more third electrical contacts 302b (see, e.g., FIGS. 4A, 10C, and 11C). A second housing unit 300 may have a second base 304 and a second cover 320. A second cover 320 may be releasably connectable (e.g., via one or more connectors, fasteners, latches, etc.) to a second base 304, such as to close the second base 304 and/or define a second internal space 306 (see, e.g., FIG. 9). One or more second electrical components 302 may be disposed in the second internal space 306.

With embodiments, such as generally illustrated in FIGS. 4B, 4C, 7, 9, and 10D, a second housing unit 300 may include a first electrical connector 308 configured to engage and/or be received in an electrical connector aperture 230 of a first housing unit 200 to, for example, facilitate establishing a mechanical connection and/or an electrical connection between the first housing unit 200 and the second housing unit 300. A first electrical connector 308 may be disposed on, integrally formed with, and/or connected to a second base 304. A first electrical connector 308 may extend from a second base 304 generally in a Z-direction. One or more second electrical components 302, such as one or more second electrical contacts 302a, may be disposed in and/or project into the first electrical connector 308 (e.g., generally in a Z-direction). When a first electrical connector 308 is engaged with and/or disposed/received in an electrical connector aperture 230 of a first housing unit 200, one or more second electrical contacts 302a may engage, contact, and/or abut one or more first electrical contacts 202a of the first housing unit 200, which may establish an electrical connection between the first housing unit 200 and/or the second housing unit 300. In some examples, a sealing member 102 (e.g., a ring seal, gasket, grommet, etc.) may be disposed and/or pressed at least partially between a first electrical connector 308 and one or more aperture walls 232, which may facilitate establishment of a sealed connection between a first housing unit 200 and a second housing unit 300. A sealing member 102 may be initially disposed in an electrical connector aperture 230 (see, e.g., FIGS. 2, 3A, and 3B) and/or on a first electrical connector 308 (see, e.g., FIGS. 4C and 9) prior to connecting a first housing unit 200 and a second housing unit 300 to one another.

With embodiments, such as generally illustrated in FIGS. 1A-2, 4A-4C, 10A-10C, and 11A-11C, a second housing unit 300 may include a second electrical connector 310 configured to engage one or more external components (e.g., a wire harness, adapter, a cable, etc.), such as to electrically connect one or more first electrical components 202 and/or one or more second electrical components 302 to one or more external components, elements, and/or devices. A second electrical connector 310 may be disposed on, integrally formed with, and/or connected to a second cover 320. A second electrical connector 310 may extend from a second cover 320 generally in a Z-direction. One or more second electrical components 302 disposed in the second housing unit 300, such as one or more third electrical contacts 302b, may be disposed in and/or project into the second electrical connector 310.

Figure 4A:
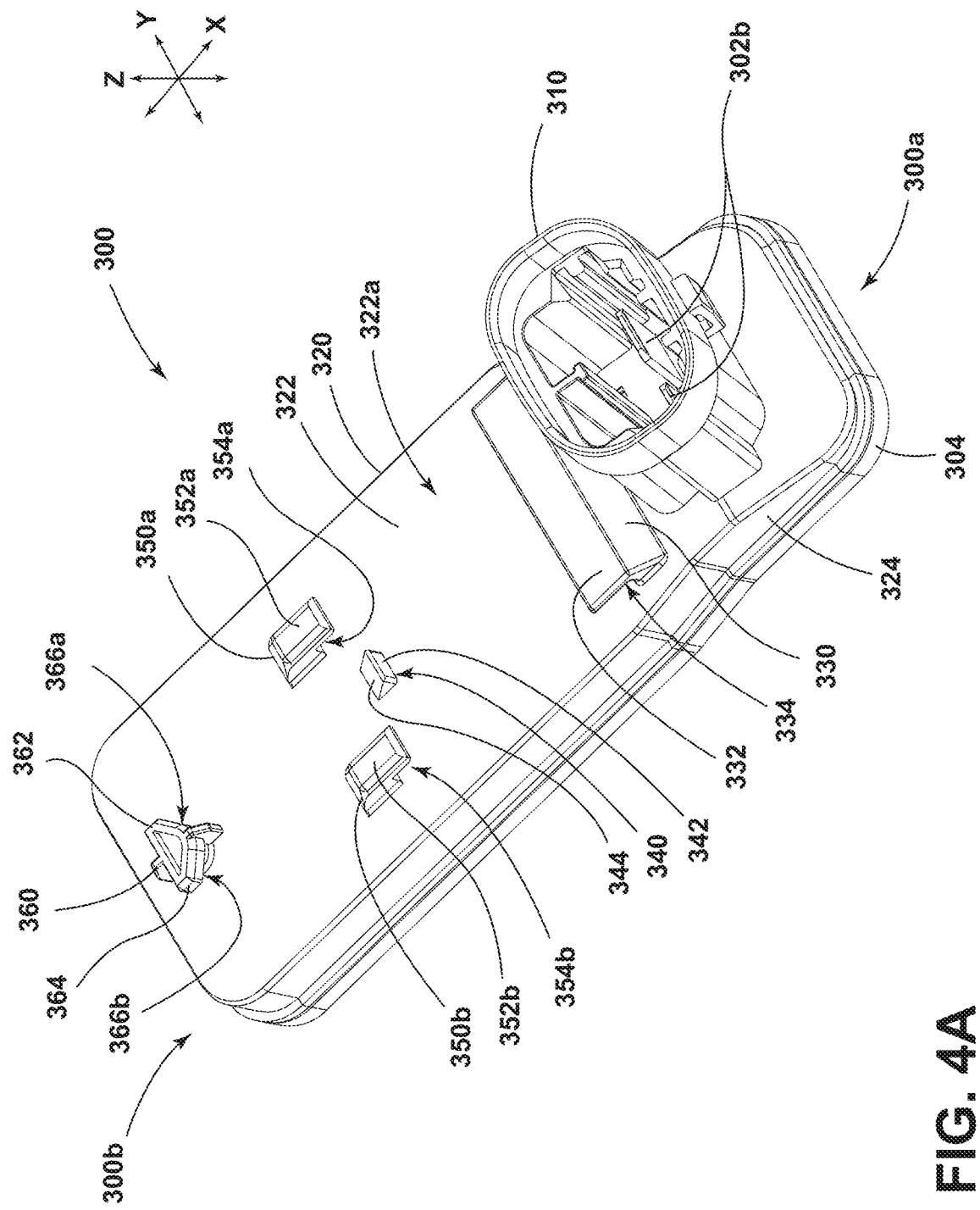
FIGS. 4A and 4B are perspective views generally illustrating an embodiment of a second housing unit according to teachings of the present disclosure.
Figure 4B:
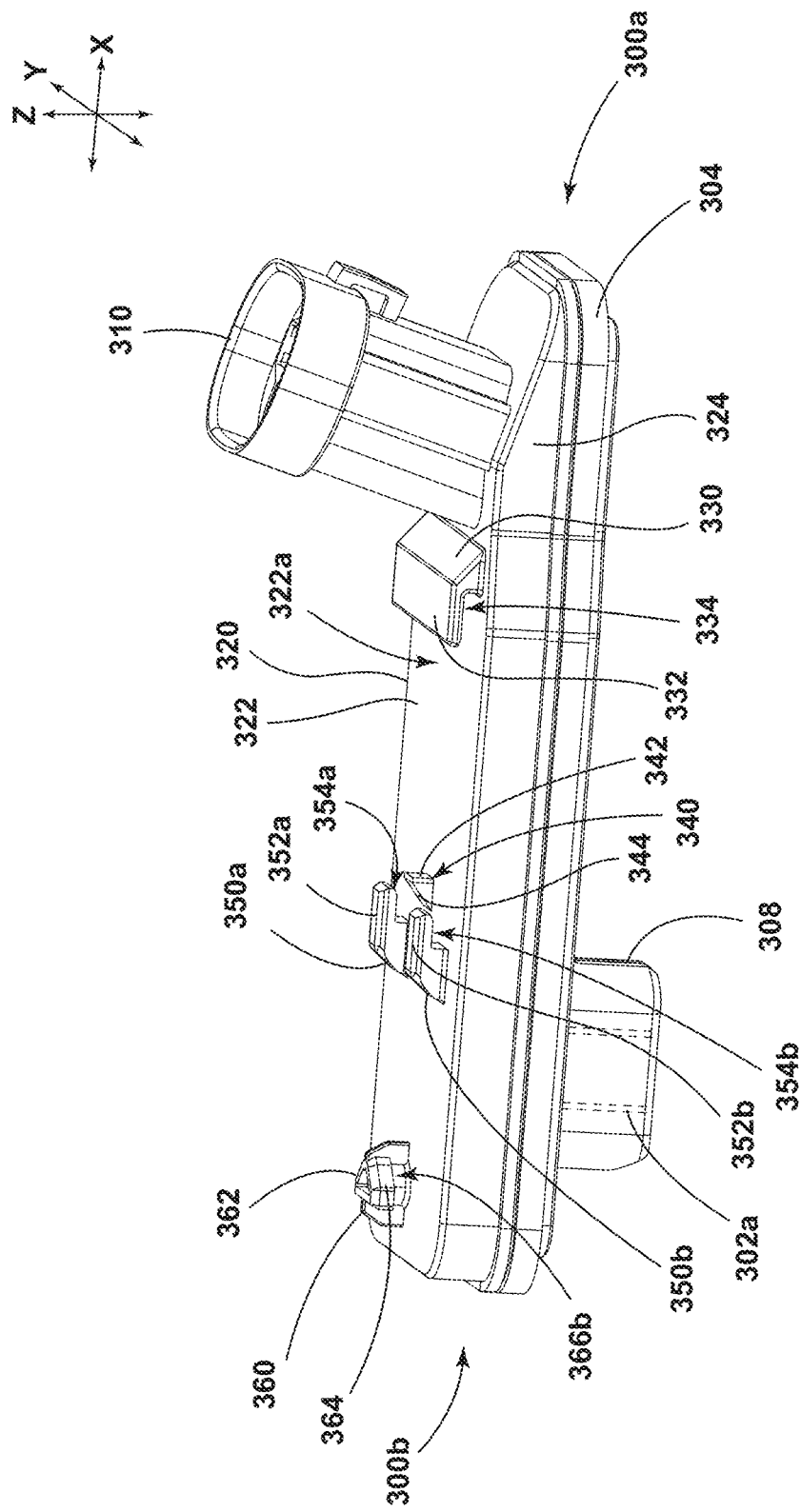
Figure 4C:
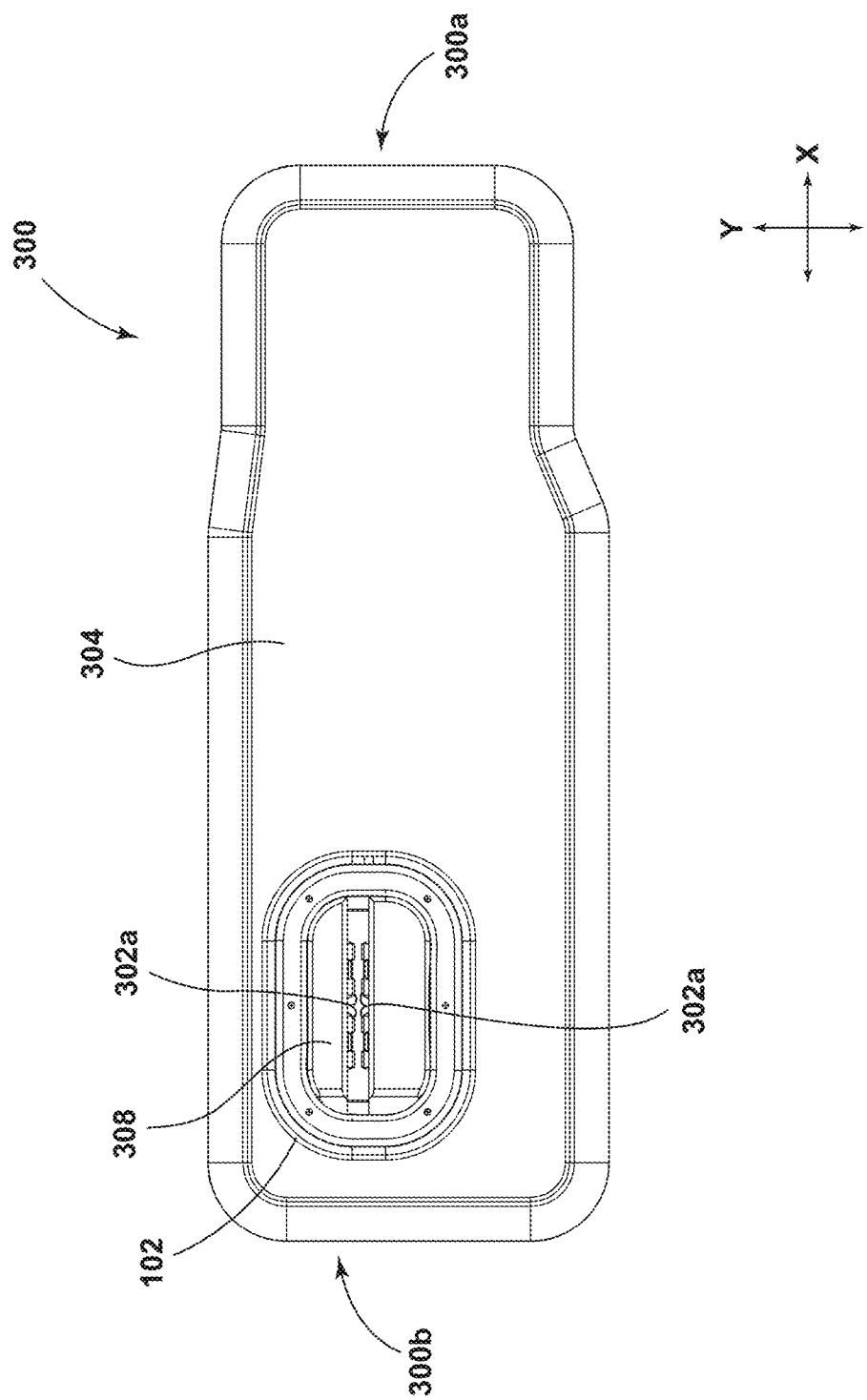
FIG. 4C is a bottom view generally illustrating an embodiment of a second housing unit according to teachings of the present disclosure.

With embodiments, such as generally illustrated in FIGS. 4A and 4B, a second cover 320 may include a second main portion 322 and one or more second wall portions 324. A second main portion 322 may be generally planar and/or have a generally rectangular shape. One or more second wall portions 324 may project away from the second main portion 322 generally in a Z-direction (e.g., perpendicularly or obliquely relative to the second main portion 322), and/or may be configured to engage, contact, and/or abut a second base 304. A second main portion 322 may have a second external surface 322a, which may face generally in a Z-direction (e.g., away from the first housing unit 200).

With embodiments, such as generally illustrated in FIGS. 4A, 4B, 6-8, 10A-10C, and 11A-11C, a second cover 320 may include one or more hook members 330 configured to engage and/or receive a portion of a locking member 400, such as when the locking member 400 is disposed in a locked position. A hook member 330 may project away from a second main portion 322 (e.g., a second external surface 322a) generally in a Z-direction (e.g., perpendicularly or obliquely relative to the second main portion 322). A hook member 330 may include a hook member protrusion 332 that may be disposed at a free end of the hook member 330 and/or may be spaced apart from a second main portion 322 (e.g., a second external surface 322a), such as in a Z-direction. A hook member protrusion 332 may extend toward a second end 300b of the second housing unit 300 (e.g., generally in an X-direction) such that the hook member 330 defines a space 334 for receiving a portion of a locking member 400 (e.g., a portion of a first end 400a of a locking member 400). A hook member 330 may engage a portion of a locking member 400 (e.g., a portion of a first end 400a of a locking member 400) when a locking member 400 is disposed in a locked position, which may connect the locking member 400 to the second housing unit 300. A hook member 330 may not engage a portion of a locking member 400 (e.g., a portion of a first end 400a of a locking member 400) when a locking member 400 is not disposed in a locked position, such as when the locking member 400 is disposed in a removal position and/or in an unlocked position.

With embodiments, such as generally illustrated in FIGS. 4A, 4B, 6-8, 10A-10C, and 11A-11C, a second cover 320 may include one or more tabs 340 configured to engage a latch 430 of a locking member 400 and/or to be received in a latch recess 432 of the latch 430, such as when the locking member 400 is disposed in a locked position. A tab 340 may not be engaged with a latch 430 and/or a latch recess 432 of a locking member 400 when the locking member 400 is not disposed in a locked position, such as when the locking member 400 is disposed in a removal position and/or an unlocked position. A tab 340 may project away from a second main portion 322 (e.g., a second external surface 322a) generally in a Z-direction (e.g., perpendicularly or obliquely relative to the second main portion 322). A tab 340 may include a stop surface 342, which may face generally toward a first end 300a of the second housing unit 300 (e.g., generally in an X-direction). A stop surface 342 of the tab 340 may engage, contact, and/or abut a latch 430 of a locking member 400 when the locking member 400 is in a locked position, which may restrict and/or prevent (i) the locking member 400 from being adjusted out of the locked position (e.g., toward an unlocked position and/or a removal position) and/or (ii) the latch 430 from disengaging the tab 340. A tab 340 may include a sloped surface 344, which may extend obliquely relative to a second external surface 322a and/or a stop surface 342. A sloped surface 344 may be configured to engage, contact, and/or deflect a latch 430 of the locking member 400 (e.g., away from the second housing unit 300 generally in a Z-direction) as the locking member 400 is adjusted toward a locked position, which may facilitate inserting a tab 340 into a latch recess 432 and/or engaging the latch 430 with the stop surface 342.

With embodiments, such as generally illustrated in FIGS. 4A, 4B, 6-8, 10A-10C, and 11A-11C, a second cover 320 may include one or more hook connectors 350a, 350b (e.g., a first hook connector 350a and/or a second hook connector 350b) that may be configured to engage and/or receive a portion of a locking member 400, such as when the locking member 400 is disposed in an unlocked position. A hook connector 350a, 350b may project away from a second main portion 322 (e.g., a second external surface 322a) generally in a Z-direction (e.g., perpendicularly or obliquely relative to the second main portion 322). A hook connector 350a, 350b may include a hook connector protrusion 352a, 352b that may be disposed at a free end of the hook connector 350a, 350b and/or may be spaced apart from a second main portion 322 (e.g., a second external surface 322a). A hook connector protrusion 352a, 352b may extend toward a first end 300a of the second housing unit 300 (e.g., generally in an X-direction) such that the hook connector 350a, 350b defines a space 354a, 354b for receiving a portion of a locking member 400 (e.g., a first locking member edge 446a and/or a second locking member edge 446b). A hook connector 350a, 350b may engage a portion of a locking member 400 (e.g., a first locking member edge 446a and/or a second locking member edge 446b) when a locking member 400 is disposed in an unlocked position, which may connect the locking member 400 to the second housing unit 300. A hook connector 350a, 350b may not engage a portion of a locking member 400 (e.g., a first locking member edge 446a and/or a second locking member edge 446b) when a locking member 400 is not disposed in an unlocked position, such as when the locking member 400 is disposed in a removal position and/or a locked position. In some examples, a first hook connector 350a and a second hook connector 350b may be disposed on opposite sides of a tab 340 relative to a Y-direction.

With embodiments, such as generally illustrated in FIGS. 4A, 4B, 6-8, 10A-10C, and 11A-11C, a second cover 320 may include one or more connectors 360 that may be configured to adjustably (e.g., slidably) engage a locking member 400. A connector 360 may be configured to be insertable into and/or removable from a slot 416 of a locking member 400 (e.g., via an expanded slot portion 416c). A connector 360 may be adjustable (e.g., slidable) within and/or along the slot 416, such as when adjusting a position of the locking member 400. A connector 360 may project away from a second main portion 322 (e.g., a second external surface 322a) generally in a Z-direction (e.g., perpendicularly or obliquely relative to the second main portion 322). A connector 360 may include one or more lateral protrusions 362, 364 (e.g., a first lateral protrusion 362 and/or a second lateral protrusion 364) that may be disposed at a free end of the connector 360 and/or may be spaced apart from a second main portion 322 (e.g., a second external surface 322a). A lateral protrusion 362, 364 may extend outward from the connector 360 (e.g., generally in a Y-direction) such that the connector 360 defines one or more spaces 366a, 366b for receiving a portion of a locking member 400. In some examples, a first lateral protrusion 362 and/or a second lateral protrusion 364 may extend from a connector 360 generally in opposite directions such that at least a portion of the connector 360 has a T-shaped cross-section in a plane perpendicular to an X-direction. A lateral protrusion 362, 364 may be configured to engage and/or contact a locking member 400, such as when a locking member 400 is disposed in an unlocked position and/or a locked position, to restrict removal of the connector 360 from a slot 416 of the locking member 400 and/or connect the locking member 400 to the second housing unit 300.

With embodiments, such as generally illustrated in FIGS. 1A, 2, 5A-10C, and 11A-11C, a locking member 400 may be releasably connectable to a first housing unit 200 and/or a second housing unit 300, such as to secure, lock, and/or fix the second housing unit 300 to the first housing unit 200. A locking member 400 may be movable (e.g., adjustable, rotatable, pivotable, slidable, etc.) relative a first housing unit 200 and/or a second housing unit 300. A locking member 400 may be movable to a locked position in which the locking member 400 may secure, lock, and/or fix a second housing unit 300 to a first housing unit 200 to restrict and/or prevent removal of the second housing unit 300 from the first housing unit 200. A locking member 400 may be movable to an unlocked position in which the locking member 400 may not secure, lock, and/or fix a second housing unit 300 to a first housing unit 200, which in turn may allow for the second housing unit 300 to be disconnected and/or removed from the first housing unit 200. When in an unlocked position, a locking member 400 may be connected to and/or mounted on a second housing unit 300 and, therefore, may be removable from the first housing unit 200 (e.g., simultaneously) with the second housing unit 300. A locking member 400 may be movable to a removal position in which the locking member 400 may be connectable to and/or disconnectable from a first housing unit 200 and/or a second housing unit 300.

Figure 5A:
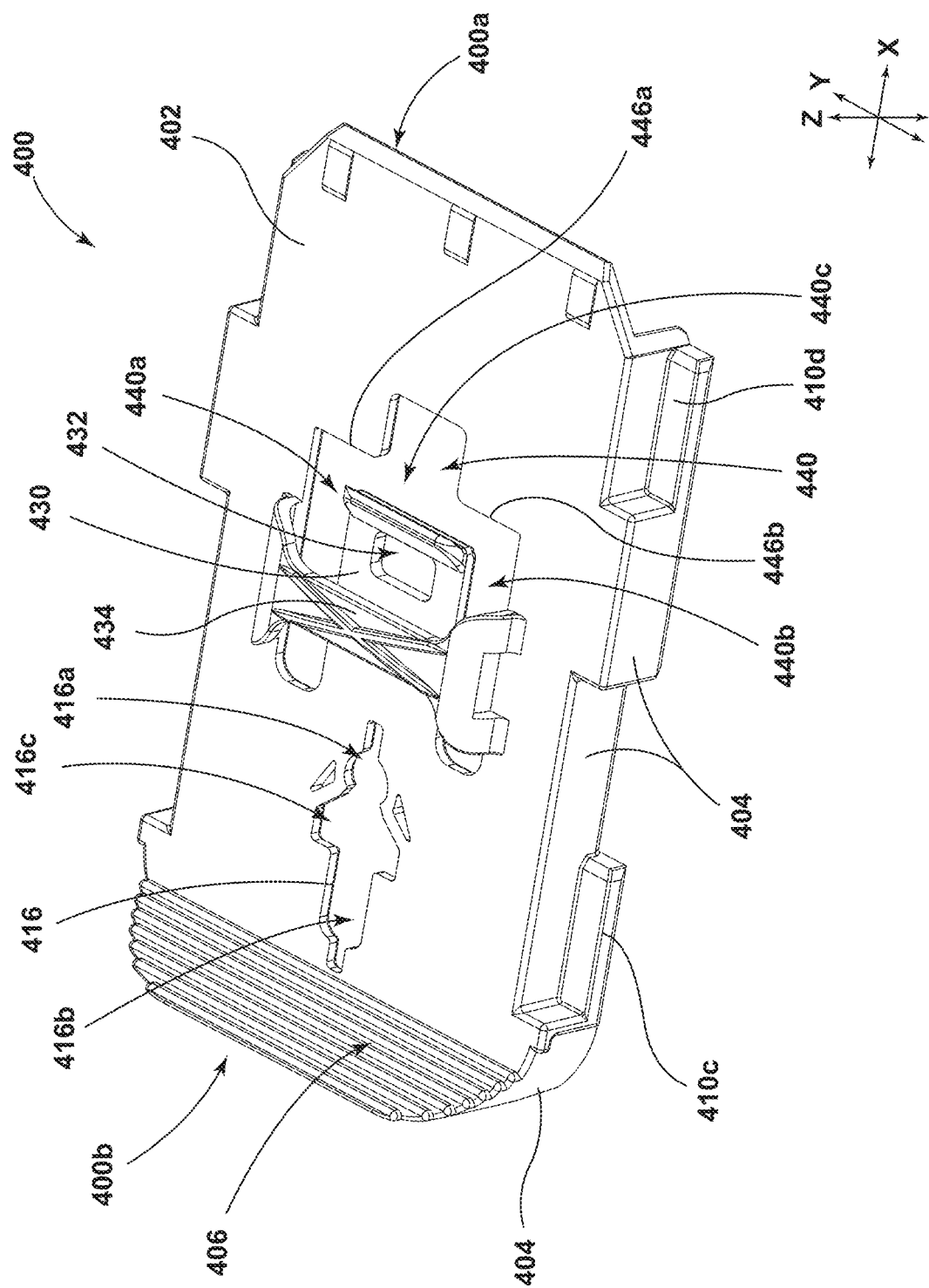
FIGS. 5A and 5B are perspective views generally illustrating an embodiment of a locking member according to teachings of the present disclosure.
Figure 5B:
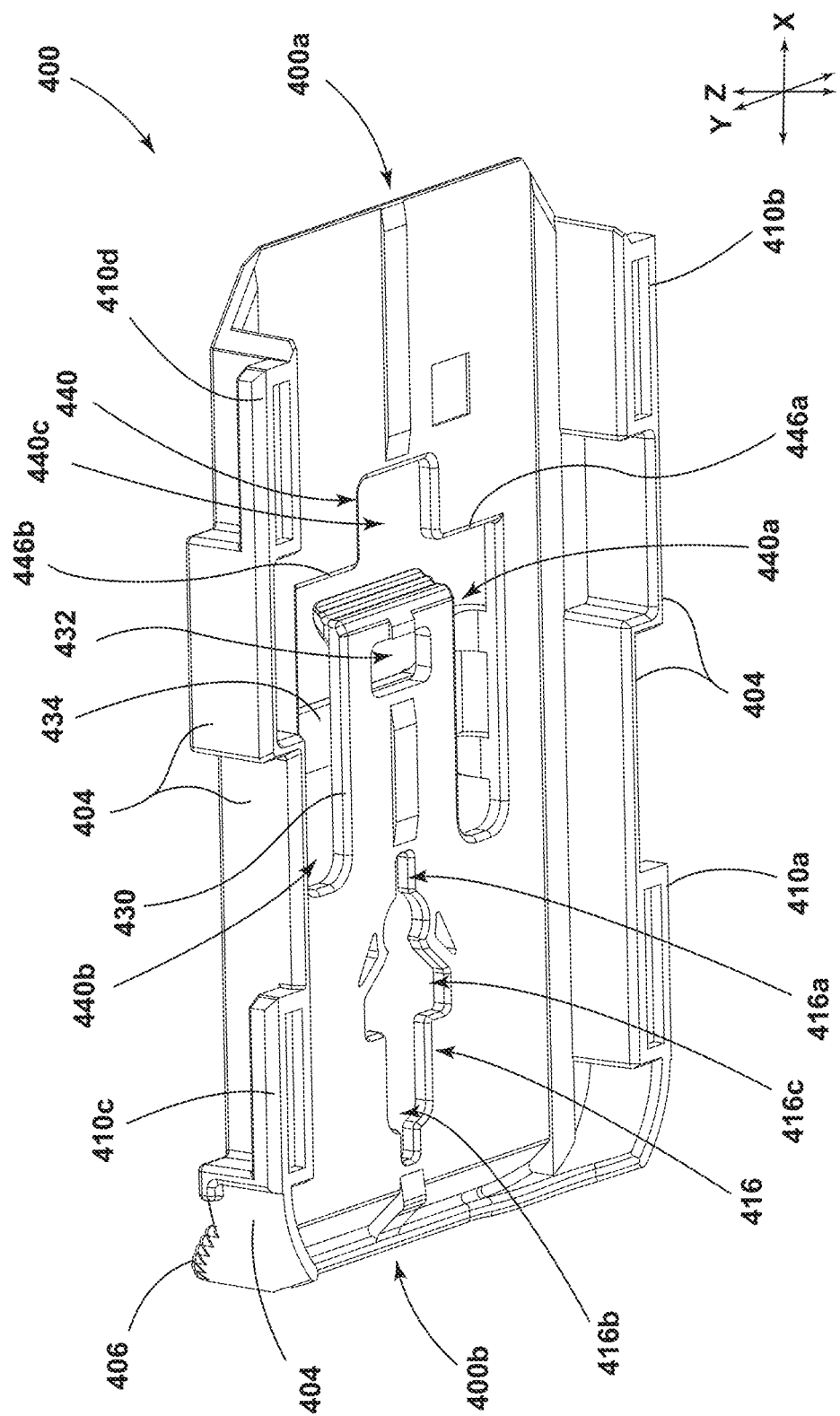

With embodiments, such as generally illustrated in FIGS. 5A and 5B, a locking member 400 may include a locking member main portion 402 and one or more locking member wall portions 404. A locking member main portion 402 may be generally planar and/or have a generally rectangular shape. One or more locking member wall portions 404 may project away from the locking member main portion 402 generally in a Z-direction (e.g., perpendicularly or obliquely relative to the locking member main portion 402), and/or may be configured to engage, contact, and/or abut a first cover 220, a second cover 320, and/or a guide portion 258a, 258b. A locking member 400 may include a grip portion 406 via which a user may grab the locking member 400, such as when adjusting a position of the locking member 400.

With embodiments, such as generally illustrated in FIGS. 5A and 5B, a locking member 400 may include one or more locking member flanges 410a-d (e.g., a first locking member flange 410a, a second locking member flange 410b, a third locking member flange 410c, and/or a fourth locking member flange 410d) that may be configured to engage a corresponding guide portion 258a, 258b and/or a corresponding guide section 260a-d of a first housing unit 200. A first locking member flange 410a may be configured to engage a first guide section 260a and/or to adjust/slide in a first groove 262a. A second locking member flange 410b may be configured to engage a second guide section 260b and/or to adjust/slide in a second groove 262b. A third locking member flange 410c may be configured to engage a third guide section 260c and/or to adjust/slide in a third groove 262c. A fourth locking member flange 410d may be configured to engage a fourth guide section 260d and/or to adjust/slide in a fourth groove 262d. A first locking member flange 410a and a third locking member flange 410c may be disposed opposite one another at or about a second end 400b of a locking member 400. A second locking member flange 410b and a fourth locking member flange 410d may be disposed opposite one another at or about a first end 400a of a locking member 400. A locking member flange 410a-d may be disposed on, connected to, and/or integrally formed with a locking member 400 (e.g., one or more locking member wall portions 404). A locking member flange 410a-d may protrude from a locking member 400 and/or one or more locking member wall portions 404 generally in a Y-direction and/or may extend along a portion of the locking member 400 generally in an X-direction. One or more locking member flanges 410a-d (e.g., all locking member flanges 410a-d) may not engage its corresponding guide section 260a-d and/or groove 262a-d when the locking member 400 is in an unlocked position. One or more locking member flanges 410a-d (e.g., all locking member flanges 410a-d) may engage its corresponding guide section 260a-d and/or groove 262a-d when the locking member 400 is not in an unlocked position, such as when the locking member 400 is in a removal position and/or a locked position.

With embodiments, such as generally illustrated in FIGS. 5A and 5B, a locking member 400 may include a slot 416 configured to adjustable receive and/or engage a connector 360 of a second housing unit 300. A slot 416 may extend longitudinally in an X-direction and/or extend through a locking member 400 (e.g., a locking member main portion 402) generally in a Z-direction. A slot 416 may include a first slot portion 416a, a second slot portion 416b, and/or an expanded slot portion 416c. A first slot portion 416a may be disposed at an end of the slot 416 disposed closer to a first end 400a of a locking member 400. A second slot portion 416b may be disposed at an opposite end of the slot 416 disposed closer to a second end 400b of a locking member 400. A first slot portion 416a and/or a second slot portion 416b may be configured to restrict and/or prevent removal of a connector 360 of the second housing unit 300 from the slot 416 (e.g., due to the connector 360 and/or one or more lateral protrusions 362, 364 contacting the locking member main portion 402). An expanded slot portion 416c may be disposed between the first slot portion 416a and the second slot portion 416b relative to an X-direction. An expanded slot portion 416c may be configured to allow a connector 360 of the second housing unit 300 to be inserted into and/or removed from the slot 416. For example, a distance from a free end of the first lateral protrusion 362 to a free end of the second lateral protrusion 364 may be (i) equal to or smaller than a width of an expanded slot portion 416c (e.g., generally in a Y-direction) and/or (ii) greater than a width of the slot 416 outside of the expanded slot portion 416c (e.g., a width of the first slot portion 416a and/or a width of a second slot portion 416b). Additionally and/or alternatively, an expanded slot portion 416c may have a shape complimentary and/or similar to a connector 360 (e.g., generally triangular). Due to the varying widths of the slot 416, a connector 360 may be inserted into and/or removed from an expanded slot portion 416c of the slot 416 (e.g., when the locking member 400 is disposed in a removal position), and/or removal of the connector 360 from the slot 416 may be restricted and/or prevented when the connector 360 is disposed in the first slot portion 416a and/or the second slot portion 416b (e.g., when the locking member 400 is not disposed in the removal position). A connector 360 may be disposed in and/or aligned with the expanded slot portion 416c when the locking member 400 is disposed in a removal position. A connector 360 may be disposed in a first slot portion 416a when the locking member 400 is disposed in an unlocked position. A connector 360 may be disposed in a second slot portion 416b when the locking member 400 is disposed in a locked position.

With embodiments, such as generally illustrated in FIGS. 5A and 5B, a locking member 400 may include a latch 430 and/or a latch stop 434. A latch 430 may be configured to engage a tab 340 of a second housing unit 300, such as to secure the locking member 400 in a locked position. A latch 430 may include a latch recess 432 configured to receive a tab 340 of a second housing unit 300. A latch 430 may be configured to elastically deform (e.g., generally in a Z-direction). A latch 430 may be configured to be deflected away from a second housing unit 300 toward a deflected position via a sloped surface 344 of a tab 340 when the locking member 400 is adjusted toward a locked position and/or to return to an undeflected position when the locking member 400 reaches the locked position and the latch 430 transitions from contacting the sloped surface 344 to contacting the stop surface 342 of the tab 340. Additionally and/or alternatively, a latch 430 may be configured to be actuated and/or deflected by a user to disengage the latch 430 and the tab 340 from one another, which may enable the locking member 400 to be adjusted out of the locked position (e.g., toward a removal position and/or an unlocked position). For example and without limitation, the latch 430 may latch the locking member 400 in the locked position until released by user. A latch stop 434 may be configured to contact and/or abut a latch 430 to restrict flexing and/or deflection of the latch 430 beyond a certain point, such as when the latch 430 is actuated by a user (e.g., to prevent damage to the latch 430). A latch stop 434 may be disposed at least partially above a latch 430 and/or a locking member opening 440 relative to a Z-direction, and/or may extend from a first side of a locking member 400 to a second side of a locking member 400 (e.g., generally in a Y-direction). The latch stop 434 may, for example, include a U-shaped configuration that may open toward the latch 430. The latch stop 434 may be configured such that the hook connectors 350a-b can move and/or slide under the latch stop 434 as the locking member 400 moves between positions.

With embodiments, such as generally illustrated in FIGS. 5A and 5B, a locking member 400 may include a locking member opening 440 configured to receive one or more hook connectors 350a, 350b and/or a tab 340 of a second housing unit 300. A locking member opening 440 may extend through a locking member 400 (e.g., a locking member main portion 402) generally in a Z-direction. A latch 430 of the locking member 400 may project into the locking member opening 440, such as generally in an X-direction. A locking member opening 440 may include a first opening portion 440a, a second opening portion 440b, and/or a third opening portion 440c (e.g., a notched opening portion). A first opening portion 440a and/or a second opening portion 440b may be disposed and/or defined on opposite sides of a latch 430 relative to a Y-direction, and/or may extend adjacent to the latch 430 generally in an X-direction. A first opening portion 440a may be defined at least partially by a first locking member edge 446a of the locking member 400. A second opening portion 440b may be defined at least partially by a second locking member edge 446b of the locking member 400. A third opening portion 440c may be disposed between the first opening portion 440a and/or the second opening portion 440b (e.g., relative to a Y-direction). A first opening portion 440a may be configured to adjustably receive a first hook connector 350a, a second opening portion 440b may be configured to adjustably receive a second hook connector 350b, and/or a third opening portion 440c may be configured to adjustably receive a tab 340. The openings 440a-c may, for example, be configured to function as tracks that receive the tab 340 and/or the hook connectors 350a-b to restrict movement of the locking member 400 relative to the second housing unit 300 and/or the first housing unit 200, such as to restrict X-direction, Y-direction, and/or Z-direction movement of the locking member 400.

Figure 7:
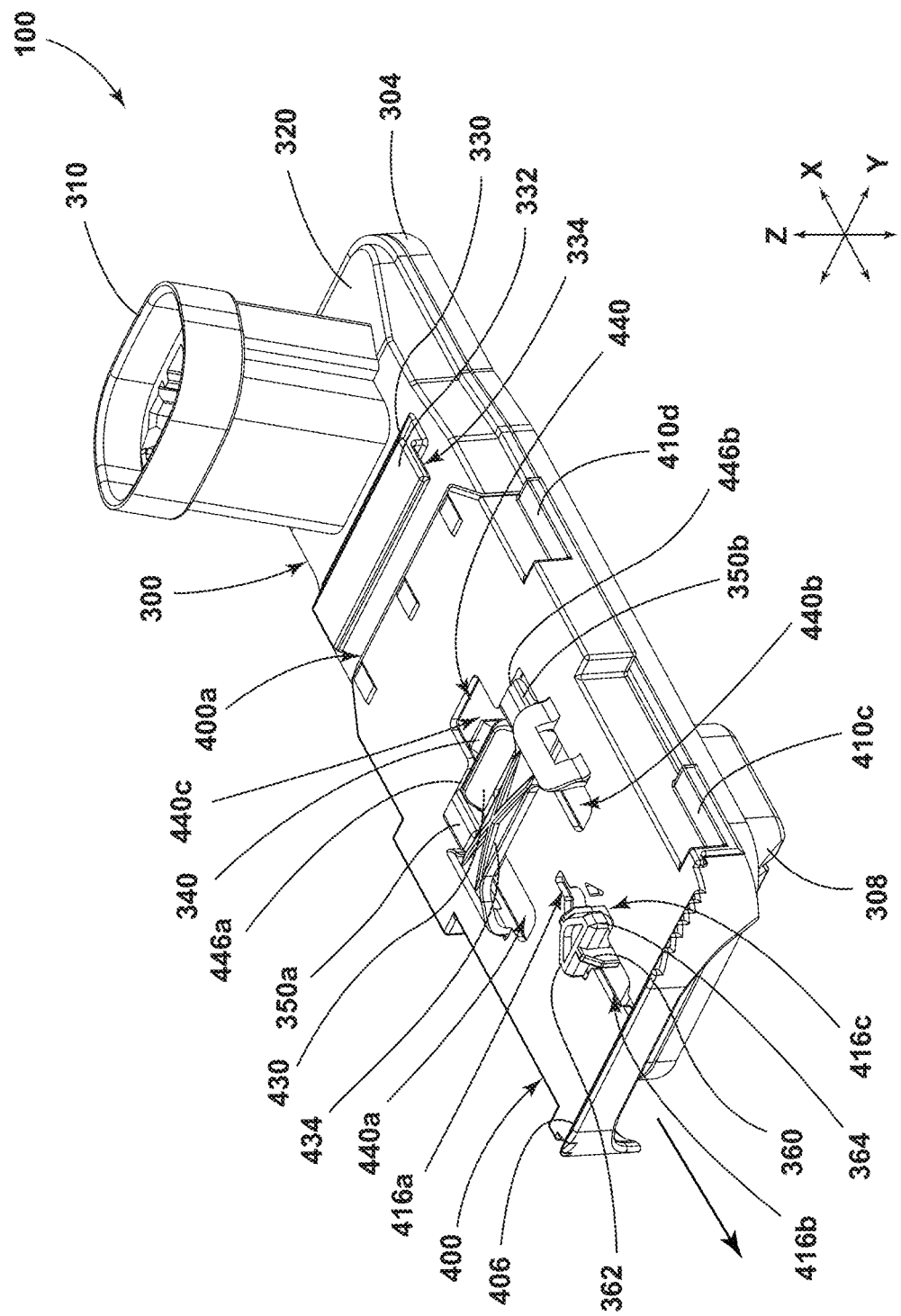
FIG. 7 is a perspective view generally illustrating an embodiment of a locking member in a removal position disposed on a second housing unit according to teachings of the present disclosure.

With embodiments, such as generally illustrated in FIG. 7, a locking member 400 may be moved (e.g., adjusted, rotated, pivoted, slid, etc.) to a removal position. When a locking member 400 is in a removal position, (i) a connector 360 may be disposed in and/or aligned with an expanded slot portion 416c, which may allow for the connector 360 to be removed from the slot 416 (e.g., in a Z-direction), (ii) a first hook connector 350a may be disposed in a first opening portion 440a and may not engage a first locking member edge 446a, (iii) a second hook connector 350b may be disposed in a second opening portion 440b and may not engage a second locking member edge 446b, (iv) a tab 340 may be disposed in a third opening portion 440c and may not engage a latch 430 and/or a latch recess 432, and/or (v) a hook member 330 may not engage the locking member 400. As such, a locking member 400 may be connectable to and/or disconnectable from a second housing unit 300 (e.g., a second cover 320) when the locking member 400 is disposed in a removal position. A locking member 400 may be connected to and/or disconnected from a second housing unit 300 before the second housing unit 300 is disposed on and/or connected to a first housing unit 200, which may facilitate assembly of the electrical assembly 100. Additionally and/or alternatively, a locking member 400 may be connected to and/or disconnected from a second housing unit 300 after the second housing unit 300 is disposed on and/or connected to a first housing unit 200. In some examples, when a locking member 400 is in a removal position, the locking member 400 may substantially restrict, block, and/or prevent a second housing unit 300 from being disposed in a receptacle 240 and/or connected to a first housing unit 200 (e.g., via one or more locking member flanges 410a-d being misaligned with a corresponding notch 264a-d, contacting a corresponding guide section 260a-d, and/or contacting a corresponding protrusion 266a-d). When in a removal position, a locking member 400 may also substantially restrict, block, and/or prevent a second housing unit 300 from being removed from a receptacle 240 and/or disconnected from a first housing unit 200 (e.g., via one or more locking member flanges 410a-d being misaligned with a corresponding notch 264a-d, contacting a corresponding guide section 260a-d, and/or contacting a corresponding protrusion 266a-d).

With embodiments, such as generally illustrated in FIGS. 8-10C, a locking member 400 may be moved (e.g., adjusted, rotated, pivoted, slid, etc.) to an unlocked position. When a locking member 400 is disposed in an unlocked position, (i) a connector 360 may be disposed in a first slot portion 416a, which may restrict and/or prevent removal of the connector 360 from the slot 416, (ii) a first hook connector 350a may be disposed in a first opening portion 440a and may engage a first locking member edge 446a, (iii) a second hook connector 350b may be disposed in a second opening portion 440b and may engage a second locking member edge 446b, (iv) a tab 340 may be disposed in a third opening portion 440c and may not engage a latch 430, (v) a hook member 330 may not engage the locking member 400, and/or (vi) one or more locking member flanges 410a-d (e.g., all locking member flanges 410a-d) may be disposed relative to a second housing unit 300 and/or a first electrical connector 308 such that (a) the locking member flanges 410a-d are insertable through a notch 264a-d and into a groove 262a-d of the corresponding guide section 260a-d of a first housing unit 200 when inserting the first electrical connector 308 into an electrical connector aperture 230 of the first housing unit 200, and/or (b) the locking member flanges 410a-d are removable from the groove 262a-d (via the notch 264a-d) of the corresponding guide section 260a-d when removing the first electrical connector 308 from the electrical connector aperture 230. As such, when a locking member 400 is disposed in an unlocked position, the locking member 400 may be connected to and/or mounted on a second housing unit 300 (e.g., a second cover 320) but may not be engaged with and/or connected to a first housing unit 200.

With embodiments, such as generally illustrated in FIGS. 1A and 11A-11C, a locking member 400 may be moved (e.g., adjusted, rotated, pivoted, slid, etc.) to a locked position. When a locking member 400 is disposed in a locked position, (i) a connector 360 may be disposed in a second slot portion 416b of the slot 416, which may restrict and/or prevent removal of the connector 360 from the slot 416, (ii) a first hook connector 350a may be disposed in a first opening portion 440a and may not engage a first locking member edge 446a, (iii) a second hook connector 350b may be disposed in a second opening portion 440b and may not engage a second locking member edge 446b, (iv) a tab 340 may engage a latch 430 and/or may be disposed in a latch recess 432, (v) a hook member 330 may engage a portion of the locking member 400 (e.g., a first end 400a of the locking member 400), and/or (vi) one or more locking member flanges 410a-d (e.g., all locking member flanges 410a-d) may be (a) disposed relative to a second housing unit 300 and/or a first electrical connector 308 such that the locking member flanges 410a-d are disposed in a groove 262a-d of a corresponding guide section 260a-d of a first housing unit 200 and/or (b) engaged with a protrusion 266a-d (e.g. a first surface portion 270a-d and/or a second surface portion 272a-d) of the corresponding guide section 260a-d, which may restrict and/or prevent removal of the locking member flanges 410a-d from the grooves 262a-d (e.g., via the notches 264a-d). As such, when a locking member 400 is disposed in a locked position, the locking member 400 may be connected to, engaged with, and/or mounted on a first housing unit 200 (e.g., a first cover 220) and/or a second housing unit 300 (e.g., a second cover 320). Additionally, the second housing unit 300 may be pressed and/or sandwiched between the locking member 400 (e.g., the main portion of the locking member 400) and/or the first housing unit 200 (e.g., the first cover 220) generally in a Z-direction, which may connect, secure, lock, and/or fix the second housing unit 300 to the first housing unit 200 to restrict and/or prevent removal of the second housing unit 300 from the first housing unit 200.

Figure 6:
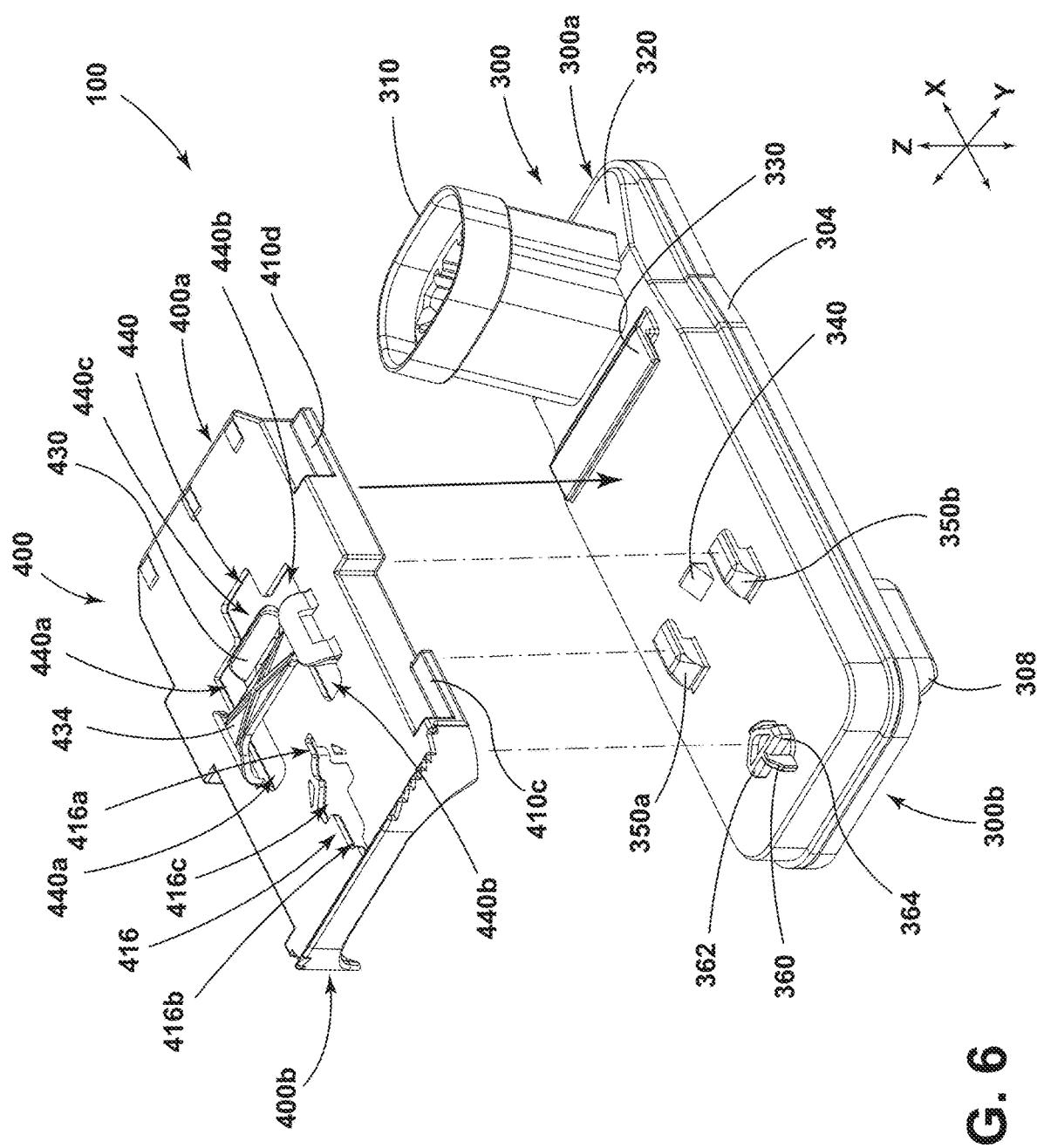
FIG. 6 is a perspective view generally illustrating an embodiment of a locking member disposed above and vertically aligned with a second housing unit according to teachings of the present disclosure.
Figure 8:
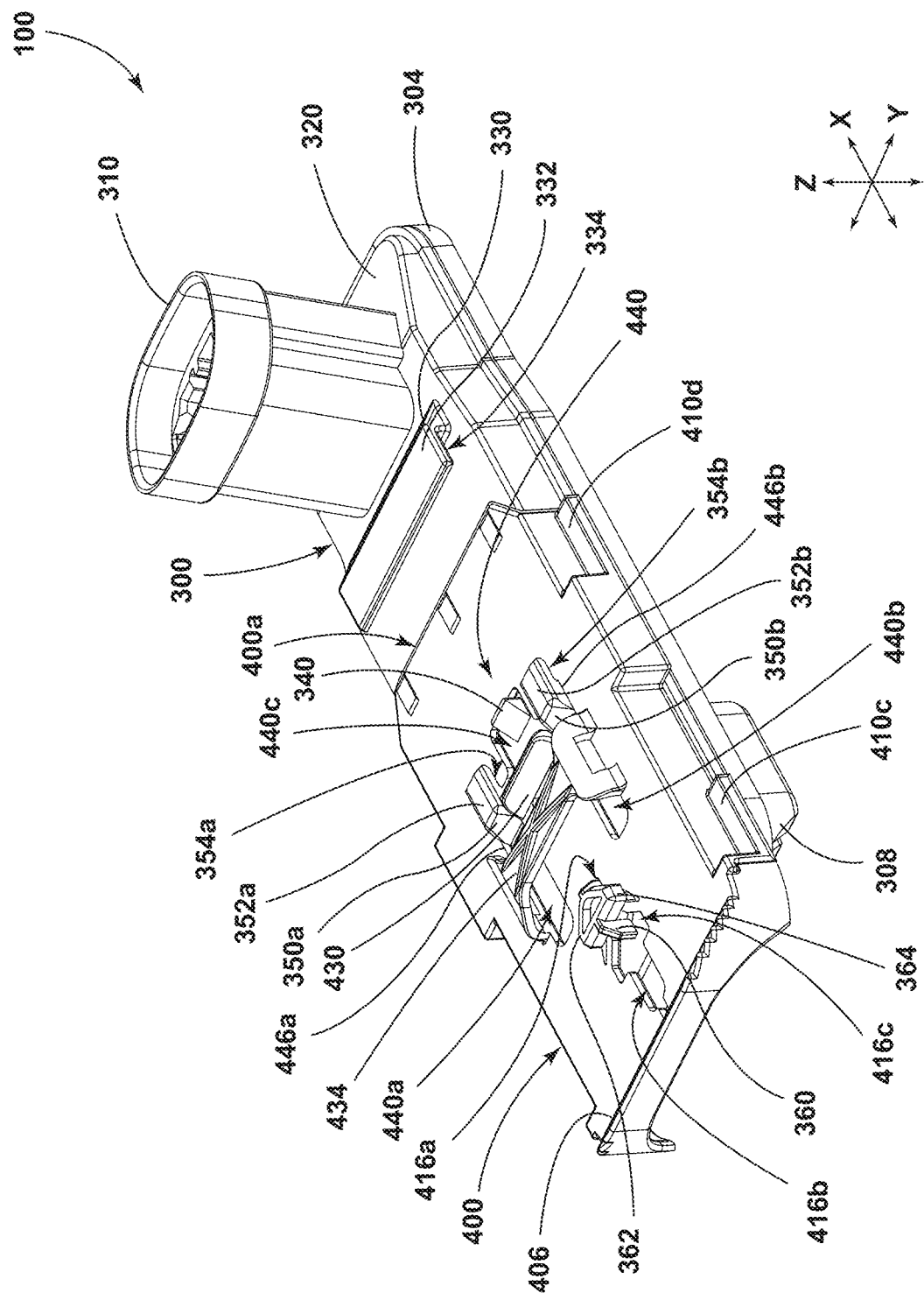
FIG. 8 is a perspective view generally illustrating an embodiment of a locking member in an unlocked position disposed on a second housing unit according to teachings of the present disclosure.

An embodiment of a method of assembling at least a portion of an electrical assembly 100 is generally illustrated in FIGS. 6-11C. The method may include connecting a locking member 400 to a second housing unit 300 as generally illustrated in FIGS. 6-8. Optionally, the method may include connecting a second housing unit 300 to a first housing unit 200 after connecting the locking member 400 to the second housing unit 300, as generally illustrated in FIGS. 9-11C. Alternatively, the method may include connecting the second housing unit 300 to the first housing unit 200 prior to connecting the locking member 400 to the second housing unit 300 (see, e.g., FIG. 1B). An embodiment of a method of disassembling at least a portion of an electrical assembly 100 may include disengaging the latch 430 from the tab 340 (e.g., via actuating and/or deflecting the latch 430) and/or performing one or more of the steps described below, such as in performing one or more of the steps in the opposite direction and/or performing one or more of the steps in the reverse order.

With embodiments, connecting a locking member 400 to a second housing unit 300 and/or a second cover 320 may include aligning (e.g., generally in a Z-direction) a connector 360 with an expanded slot portion 416c, a first hook connector 350a with a first opening portion 440a, a second hook connector 350b with a second opening portion 440b, and/or a tab 340 with a third opening portion 440c (see, e.g., FIG. 6). Once aligned, the locking member 400 may then be adjusted and/or moved onto the second housing unit 300 (e.g., generally in a Z-direction) such that the locking member 400 is disposed in a removal position (see, e.g., FIG. 7). Adjusting and/or moving the locking member 400 onto the second housing unit 300 may include inserting a connector 360 into an expanded slot portion 416c, inserting a first hook connector 350a into a first opening portion 440a, inserting a second hook connector 350b into a second opening portion 440b, and/or inserting a tab 340 into a third opening portion 440c. The locking member 400 may then be moved and/or adjusted (e.g., generally in an X-direction) from the removal position (see, e.g., FIG. 7) toward and/or to an unlocked position (see, e.g., FIG. 8), such as by sliding, rotating, pivoting, etc. Moving and/or adjusting a locking member 400 from a removal position toward and/or into an unlocked position may include sliding a connector 360 within the slot 416 from an expanded slot portion 416c to a first slot portion 416a, engaging a first hook connector 350a with a first locking member edge 446a, and/or engaging a second hook connector 350b with a second locking member edge 446b, which may connect the locking member 400 to the second housing unit 300 and/or restrict removal of the locking member 400 from the second housing unit 300.

Figure 9:
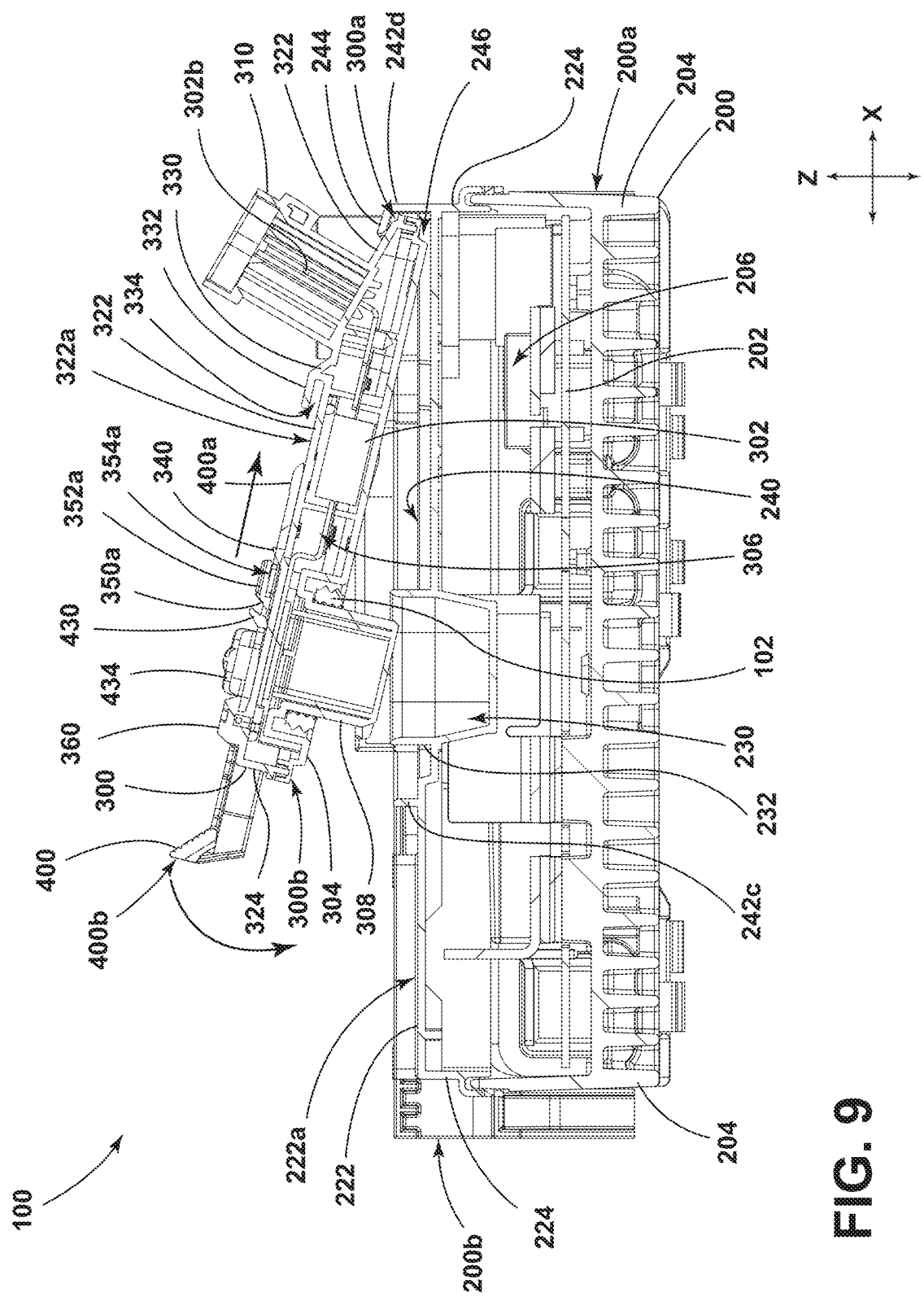
FIG. 9 is a cross-sectional view generally illustrating an embodiment of a second housing unit partially disposed in a receptacle of a first housing unit according to teachings of the present disclosure.

With embodiments, such as generally depicted in FIG. 9, connecting a second housing unit 300 to a first housing unit 200 may include inserting (e.g., generally in an X-direction) a portion of a first end 300a of the second housing unit 300 into a receptacle 240 and/or an opening 246 of the first housing unit 200 and subsequently adjusting, moving, rotating, pivoting, etc. (e.g., generally in a Z-direction) a second end 300b of the second housing unit 300 into the receptacle 240. Adjusting and/or moving a second end 300b of the second housing unit 300 into the receptacle 240 may include engaging and/or inserting a first electrical connector 308 into an electrical connector aperture 230, which may include engaging and/or contacting one or more first electrical contacts 202a with one or more second electrical contacts 302a to establish an electrical connection between the first housing unit 200 and/or the second housing unit 300 (see, e.g., FIG. 10D). Additionally and/or alternatively, adjusting and/or moving a second end 300b of the second housing unit 300 into the receptacle 240 may include inserting (e.g., generally in a Z-direction) a first locking member flange 410a through a first notch 264a and into a first groove 262a of a first guide section 260a, a second locking member flange 410b through a second notch 264b and into a second groove 262b of a second guide section 260b, a third locking member flange 410c through a third notch 264c and into a third groove 262c of a third guide section 260c, and/or a fourth locking member flange 410d through a fourth notch 264d and into a fourth groove 262d of a fourth guide section 260d to a position generally illustrated in FIGS. 10A-10C.

With embodiments, the locking member 400 may then be moved from the unlocked position (see, e.g., FIGS. 10A-10C) to a locked position (see, e.g., FIGS. 11A-11C), which may connect the locking member 400 to the first housing unit 200, which may in turn secure, lock, and/or fix the second housing unit 300 to the first housing unit 200 via the locking member 400 to restrict and/or prevent removal of the second housing unit 300 from the first housing unit 200. Adjusting a locking member 400 from the unlocked position to the locked position may include adjusting and/or sliding (e.g., generally in an X-direction) a first locking member flange 410a through a first groove 262a to engage a first protrusion 266a, a second locking member flange 410b through a second groove 262b to engage a second protrusion 266b, a third locking member flange 410c through a third groove 262c to engage a third protrusion 266c, and/or a fourth locking member flange 410d through a fourth groove 262d to engage a fourth protrusion 266d, which may connect the locking member 400 and/or the second housing unit 300 to the first housing unit 200. Adjusting a locking member flange 410a-d through a groove 262a-d may include engaging, contacting, and/or sliding the locking member flange 410a-d along a first surface portion 270a-d of the protrusion 266a-d (e.g., generally in an X-direction) to engage the second surface portion 272a-d, which may adjust and/or move at least a portion of the locking member 400 toward the first housing unit 200 (e.g., generally in a Z-direction) and/or push the second housing unit 300 toward and/or against the first housing unit 200, which may ensure a tight and secure connection between the first housing unit 200 and the second housing unit 300. Additionally and/or alternatively, adjusting a locking member 400 from the unlocked position to the locked position may include sliding a connector 360 within the slot 416 from a first slot portion 416a to a second slot portion 416b, adjusting a first hook connector 350a within a first opening portion 440a to disengage the first hook connector 350a from a first locking member edge 446a, adjusting a second hook connector 350b within a second opening portion 440b to disengage the second hook connector 350b from a second locking member edge 446b, engaging at least a portion of a locking member 400 (e.g., a first end 400a) with a hook member 330, and/or engaging a latch 430 with a tab 340. Engaging a latch 430 with a tab 340 may include deflecting the latch 430 away from the second housing unit 300 via sliding the latch 430 along a sloped surface 344 of the tab 340, inserting the tab 340 into a latch recess 432 of the latch 430, and/or engaging/contacting a stop surface 342 of the tab 340 with the latch 430, which may restrict and/or prevent the locking member 400 from adjusting and/or moving out of the locked position (e.g., toward a removal position and/or an unlocked position).

While embodiments are generally illustrated with the first housing unit 200 including one or more guide portions 258a, 258b and the locking member 400 including one or more locking member flanges 410a-d, embodiments may also include the opposite configuration or a combination/mixture of guide portion/flange configurations. While embodiments are generally illustrated with the second housing unit 300 including one or more connectors 360, tabs 340, hooks members 330, and/or hook connectors 350a, 350b, and the locking member 400 including one or more slots 416, openings 440, latches 430, and/or edges 446a, 446b, embodiments may also include the opposite configuration or a combination/mixture of the connector/slot, tab/latch, and/or hook/edge configurations.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. Uses of "e.g." and "such as" in the specification are to be construed broadly and are used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

What is claimed is:

1. An electrical assembly, comprising:
a first housing unit including a guide portion;
a second housing unit releasably connectable to the first housing unit; and
a locking member configured to slidably engage the guide portion;
wherein the locking member is disposed at least partially within the first housing unit;
wherein the locking member is adjustable relative to the first housing unit and the second housing unit to an unlocked position and a locked position;
wherein, when the locking member is in the unlocked position, the second housing unit is removable from the first housing unit;
wherein, when the locking member is in the locked position, the second housing unit is secured to the first housing unit via the locking member; and
wherein the second housing unit includes a hook connector configured to engage the locking member and, when the locking member is in the unlocked position, the hook connector engages the locking member and connects the locking member to the second housing unit.

2. The electrical assembly of claim 1, wherein the locking member is removably and slidably connected to the second housing unit.

3. The electrical assembly of claim 1, wherein:
the locking member includes a slot;
the second housing unit includes a connector projecting therefrom, the connector disposed at least partially in the slot;
when the locking member is adjusted toward the unlocked position, the connector slides along the slot toward a first end of the slot; and when the locking member is adjusted toward the locked position, the connector slides along the slot toward a second end of the slot disposed opposite the first end of the slot.

4. The electrical assembly of claim 3, wherein:
the connector includes a lateral protrusion; and
the lateral protrusion of the connector is configured to engage the locking member to restrict removal of the connector from the slot and to connect the locking member to the second housing unit.

5. The electrical assembly of claim 3, wherein:
the locking member is removably and slidably connected to the second housing unit;
the locking member is adjustable to a removal position;
the slot includes an expanded portion via which the connector is insertable and/or removable from the slot; and
when the locking member is in the removal position, the connector is disposed in the expanded portion of the slot such that the locking member is removable from the second housing unit.

6. The electrical assembly of claim 5, wherein:
the connector includes a first lateral protrusion and a second lateral protrusion;
the first lateral protrusion and the second lateral protrusion extend from an end of the connector in opposite directions; and
a distance from a free end of the first lateral protrusion to a free end of the second lateral protrusion is:
equal to or smaller than a width of the expanded portion of the slot; and
greater than a width of the slot outside of the expanded portion.

7. The electrical assembly of claim 1, wherein:
the second housing unit includes a hook member configured to engage the locking member; and
when the locking member is in the locked position, the hook member engages the locking member and connects the locking member to the second housing unit.

8. The electrical assembly of claim 1, wherein:
the second housing unit includes a tab;
the locking member includes a latch configured to engage the tab; and
when the locking member is in the locked position, the latch engages the tab and restricts adjustment of the locking member toward the unlocked position.

9. The electrical assembly of claim 8, wherein:
the locking member includes a latch stop; and
the latch stop is disposed spaced apart from the latch and configured to restrict flexing of the latch.

10. The electrical assembly of claim 1, wherein:
the first housing unit includes (i) an opening configured to receive a portion of the second housing unit and (ii) an electrical connector receptacle;
the second housing unit includes an electrical connector; and
the opening, the electrical connector receptacle, and the electrical connector are configured such that the portion of the second housing unit is insertable into the opening in a first direction and, subsequently, the second housing unit is adjustable in a second direction, which is different than the first direction, to engage the electrical connector with the electrical connector receptacle.

11. The electrical assembly of claim 1, wherein:
the second housing unit further includes:
a connector;
a tab; and
a hook member;

the locking member includes:
a slot configured to receive the connector;
a flange configured to slidably engage a groove of the guide portion; and
a latch configured to engage the tab;
the connector is slidably disposed in the slot;
when the locking member is in the unlocked position:
the connector is disposed in a first slot portion of the slot;
the hook connector is engaged with the locking member; and
the locking member is connected to the second housing unit via the connector and the hook connector;
when the locking member is in the locked position:
the flange is engaged with the groove and connects the locking member to the first housing unit;
the connector is disposed in a second slot portion of the slot;
the latch is engaged with the tab and resists adjustment of the locking member toward the unlocked position; and
the hook member is engaged with the locking member.

12. The electrical assembly of claim 11, wherein:
the locking member is removably and slidably connected to the second housing unit;
the locking member is adjustable to a removal position;
the slot includes an expanded slot portion via which the connector is insertable and/or removable from the slot;
the expanded slot portion of the slot is disposed between the first slot portion and the second slot portion; and
when the locking member is in the removal position, the connector is disposed in the expanded slot portion such that the locking member is removable from the second housing unit.

13. A method of assembling the electrical assembly of claim 1, comprising:
releasably connecting the first housing unit and the second housing unit; and
restricting the first housing unit and the second housing unit from disconnecting via adjusting the locking member from the unlocked position to the locked position;
wherein adjusting the locking member from the unlocked position to the locked position includes engaging the locking member with the guide portion of the first housing unit.

14. The method of claim 13, wherein:
engaging the locking member with the guide portion includes inserting a flange of the locking member into a groove of the guide portion, wherein the groove is at least partially defined by a guide surface of the guide portion having a first surface portion and a second surface portion, and the first surface portion is sloped toward an internal space of the first housing unit; and
adjusting the locking member from the unlocked position to the locked position includes moving the second housing unit toward the first housing unit via sliding the flange along the first surface portion toward the second surface portion.

15. The method of claim 13, including:
prior to connecting the first housing unit and the second housing unit, disposing the locking member on the second housing unit in a removal position; and
releasably connecting the locking member to the second housing unit via adjusting the locking member from the removal position to the unlocked position;

wherein, when the locking member is disposed in the removal position, the locking member is disposable on and removable from the second housing unit.

16. The method of claim 15, wherein:
adjusting the locking member from the removal position to the unlocked position includes engaging the locking member with the hook connector of the second housing unit; and
adjusting the locking member from the unlocked position to the locked position includes:
disengaging the locking member from the hook connector; and
engaging the locking member with a hook member of the second housing unit.

17. An electrical assembly, comprising:
a first housing unit including a guide portion;
a second housing unit releasably connectable to the first housing unit; and
a locking member configured to slidably engage the guide portion;
wherein the locking member is adjustable relative to the first housing unit and the second housing unit to an unlocked position and a locked position;
wherein, when the locking member is in the unlocked position, the second housing unit is removable from the first housing unit;
wherein, when the locking member is in the locked position, the second housing unit is secured to the first housing unit via the locking member;
wherein the locking member is linearly adjustable to a removal position from the unlocked position and the locked position; and
wherein, when the locking member is in the removal position, the locking member is removable from the second housing unit.

18. The electrical assembly of claim 17, wherein:
the locking member moves with respect to the first housing unit when transitioning between the locked position, the unlocked position, and a removal position.

19. An electrical assembly, comprising:
a first housing unit including a guide portion;
a second housing unit releasably connectable to the first housing unit; and
a locking member configured to slidably engage the guide portion;
wherein the locking member is adjustable relative to the first housing unit and the second housing unit to an unlocked position and a locked position;
wherein, when the locking member is in the unlocked position, the second housing unit is removable from the first housing unit;
wherein, when the locking member is in the locked position, the second housing unit is secured to the first housing unit via the locking member;
wherein the guide portion includes a groove configured to receive a flange of the locking member;
wherein, when the locking member is in the locked position, the flange is engaged with the groove and connects the locking member and the second housing unit to the first housing unit;
wherein the guide portion includes a guide surface that at least partially defines the groove; and
wherein the guide surface includes a first surface portion that is sloped toward an internal space of the first housing unit such that, as the locking member is adjusted toward the locked position, the locking member (i) contacts the first surface portion, (ii) is moved toward the internal space of the first housing unit, and (iii) presses the second housing unit against the first housing unit.

* * * * *